(12) United States Patent
Iwasaki et al.

(10) Patent No.: US 7,135,732 B2
(45) Date of Patent: Nov. 14, 2006

(54) SEMICONDUCTOR DEVICE

(75) Inventors: Tomio Iwasaki, Tsuchiura (JP); Hiroshi Moriya, Tsuchiura (JP); Hideo Miura, Tsuchiura (JP); Shuji Ikeda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/479,703

(22) PCT Filed: Jun. 4, 2002

(86) PCT No.: PCT/JP02/05478

§ 371 (c)(1),
(2), (4) Date: Dec. 5, 2003

(87) PCT Pub. No.: WO02/099886

PCT Pub. Date: Dec. 12, 2002

(65) Prior Publication Data

US 2004/0155276 A1    Aug. 12, 2004

(30) Foreign Application Priority Data

Jun. 5, 2001 (JP) ............................. 2001-168938
Jul. 13, 2001 (JP) ............................. 2001-213045

(51) Int. Cl.
*H01L 27/108* (2006.01)

(52) U.S. Cl. ...................... 257/302; 257/296; 438/238; 438/239; 438/242

(58) Field of Classification Search ........ 257/296–310, 257/347, 277, 508, 532; 438/238, 239, 24
See application file for complete search history.

(56) References Cited

U.S. PATENT DOCUMENTS

| 4,200,474 | A |   | 4/1980 | Morris |
|---|---|---|---|---|
| 5,185,689 | A |   | 2/1993 | Maniar |
| 6,156,606 | A | * | 12/2000 | Michaelis ................... 438/243 |
| 6,200,866 | B1 |   | 3/2001 | Ma et al. |
| 6,326,670 | B1 |   | 12/2001 | Nishiyama et al. |
| 6,475,911 | B1 | * | 11/2002 | Lane ........................ 438/686 |

FOREIGN PATENT DOCUMENTS

EP          1 096 042 A1      5/2001

(Continued)

OTHER PUBLICATIONS

Benito Decelis, et al, "Molecular Dynamics Simulation of Crack Tip Processes in Alpha-Iron and Copper", J. APPL. Phys. 54 (9), Sep. 1983, pp. 4864-4878.

(Continued)

*Primary Examiner*—Fetsum Abraham
(74) *Attorney, Agent, or Firm*—Antonelli, Terry, Stout and Kraus, LLP.

(57) ABSTRACT

In order to supply a semiconductor device having high-reliability, there are used a first capacitor electrode, a capacitor insulating film formed in contact with the first capacitor electrode and mainly composed of titanium oxide, and a second capacitor electrode formed in contact with the capacitor insulating film, and there is used a conductive oxide film mainly composed of ruthenium oxide or iridium oxide for the first capacitor electrode and the second capacitor electrode. Alternatively, there is used a gate insulating film having a titanium silicate film and titanium oxide which suppress leakage current.

6 Claims, 23 Drawing Sheets

FOREIGN PATENT DOCUMENTS

| | | |
|---|---|---|
| JP | 7263572 | 10/1995 |
| JP | 09-186299 | 7/1997 |
| JP | 10-041467 | 2/1998 |
| JP | 2000-058831 | 2/2000 |
| JP | 2000-260979 | 9/2000 |
| JP | 2002-217409 | 8/2002 |
| JP | 2002217410 | 8/2002 |
| KR | 10-0290223 | 4/1994 |
| KR | 2000-0035492 | 11/1998 |

OTHER PUBLICATIONS

Thomas Kwok, et al., "Molecular-Dynamics Studies of Grain-Boundary Diffusion. II Vacancy Migration, Diffusion Mechanism, and Kinetics", 1984 The American Physical Society, pp. 5363-5371.

S. A. Campbell, et al., "Titanium Dioxide ($TiO_2$)-Based Gate Insulators", IBM Journal of Research and Development, vol. 43, No. 3, May 1999. pp. 383-391.

Nikkei Microdevices, Mar. 2001, pp. 114-123.

* cited by examiner

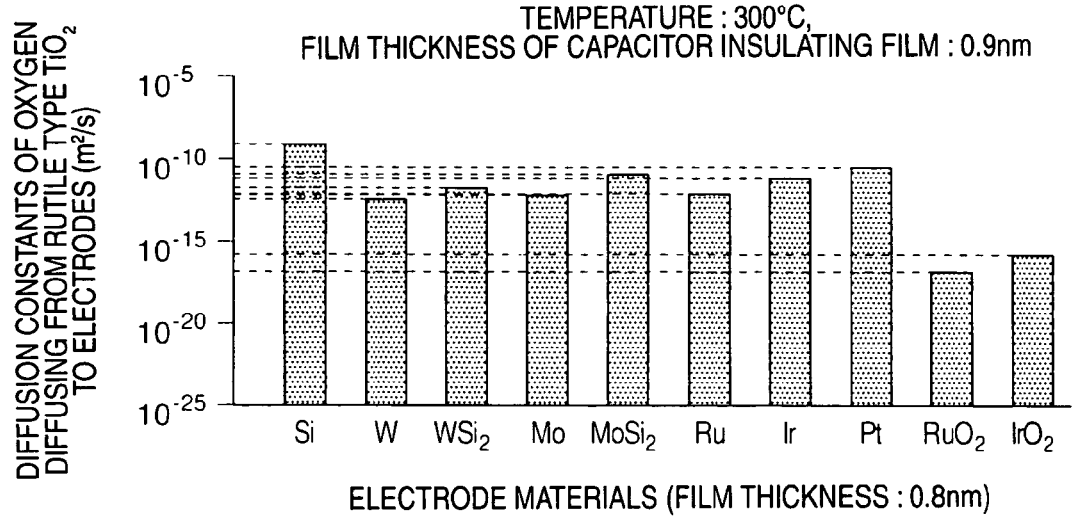
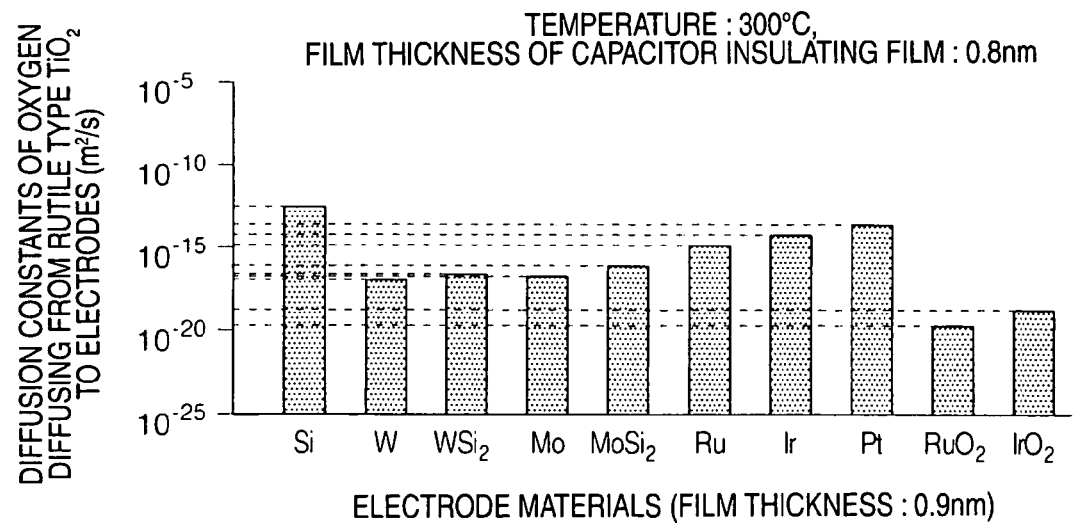

SEMICONDUCTOR DEVICE

This application is the National Stage of International Application No. PCT/JP02/05478, filed Jun. 4, 2002.

TECHNICAL FIELD

The present invention relates to a semiconductor device.

BACKGROUND ART

Recently, the area of a memory capacitor has been reduced and the absolute value of capacitance has been also reduced in accordance with miniaturization of a semiconductor device. The capacitance C, for example in the case of a parallel-plate capacitor structure, is determined by $C = \in \cdot S/d$, wherein $\in$ means the dielectric constant of a capacitor insulating film, S means the area of an electrode, and d means the film thickness (distance between electrodes) of a dielectric. In order to assure a capacitance value without increasing the area S of an electrode used for a capacitor element for information accumulation, it is necessary to use a capacitor insulating film material having a high dielectric constant $\in$ or to decrease the film thickness d of a capacitor insulating film.

Heretofore, a silicon oxide film has been used as a capacitor insulating film, and high integration has been carried out by decreasing the thickness of this film. However, in a highly integrated memory of not less than 256 megabits, reduction of the film thickness has been put to the limit, and, therefore, there has been introduced a capacitor insulating film material such as tantalum oxide that has a higher dielectric constant E than silicon oxide. Furthermore, in a DRAM (Dynamic Random Access Memory) of not less than 1 Gbit, there has been considered use of a high dielectric constant material of barium strontium titanate ($Ba_xSr_yTi_sO_z$:BST) as disclosed in, for example, JP-A-9-186299. The similar problem is applicable to not only a highly integrated memory but, also, with regard to a condenser used for various electronic circuits requiring miniaturization. For example, as disclosed in JP-A-10-41467, there has been considered use of titanium oxide having a high dielectric constant as a capacitor insulating film material for a condenser.

SUMMARY OF THE INVENTION

However, when titanium oxide was used as a capacitor insulating film and platinum was used as an electrode material as disclosed in JP-A-10-41467, the dielectric constant was found not to be stable in some cases. In consideration of various contributing factors including such cases, there is desired a semiconductor device having high reliability.

Thus, an objective of the present invention resides in providing a semiconductor device having high reliability.

In order to resolve the above problem, semiconductor devices according to the present invention include a construction in accordance with the following discussion.

Specific examples are described below.

In the first place, by providing a thin film capacitor having high reliability, there can be provided a system-in-package having high reliability. Thereby, there can be provided a semiconductor device having high reliability.

That is, said problem can be resolved by a thin film capacitor, a system-in-package, and a semiconductor device having the following constitutions.

(1) A thin film capacitor comprising a first capacitor electrode, a capacitor insulating film formed in contact with the first capacitor electrode, and a second capacitor electrode formed in contact with the capacitor insulating film, wherein said capacitor insulating film is comprised of mainly titanium oxide, and said first capacitor electrode and said second capacitor electrode use conductive oxide films comprising mainly ruthenium oxide or iridium oxide.

In this connection, it is desirable that said capacitor insulating film and said conductive oxide film have a film thickness of not less than 0.9 nm and that said titanium oxide consists of crystals of rutile structure.

(2) A system-in-package comprising a substrate and a circuit in which a LSI (Large Scale Integration Device), a condenser and a resistance are connected by wiring divided with an insulating layer on one main surface side of said substrate, wherein said condenser comprises a first capacitor electrode, a capacitor insulating film formed in contact with the first capacitor electrode, and a second capacitor electrode formed in contact with the capacitor insulating film, and wherein said capacitor insulating film comprises mainly titanium oxide and said first capacitor electrode and second capacitor electrode use conductive oxide films comprising mainly ruthenium oxide or iridium oxide.

In this connection, it is desirable that said capacitor insulating film and said conductive oxide film have a film thickness of not less than 0.9 nm and that said titanium oxide consists of crystals of rutile structure.

(3) A semiconductor device comprising a semiconductor substrate, a first capacitor electrode formed on one main surface side of said semiconductor substrate, a capacitor insulating film formed in contact with the first capacitor electrode, and a second capacitor electrode formed in contact with the capacitor insulating film, wherein said capacitor insulating film comprises mainly titanium oxide, and said first capacitor electrode and said second capacitor electrode use conductive oxide films comprising mainly ruthenium oxide or iridium oxide.

In this connection, it is desirable that said capacitor insulating film and said conductive oxide film have a film thickness of not less than 0.9 nm and that said titanium oxide consists of crystals of rutile structure. Herein, "comprise mainly" (or "consist mainly of") means "contain at least 70 at. %".

Secondly, by providing a semiconductor device having improved gate electrode structure such as a gate insulating film that can suppress leakage current effectively, there can be provided a semiconductor device having high reliability.

Recently, in a semiconductor device provided with plural MOS (Metal Oxide Semiconductor) transistors each of which has a gate insulating film present between a semiconductor substrate and a gate electrode, reduction in thickness of the gate insulating film has been required and an oxide film of not more than 3.0 nm in thickness has been used in accordance with miniaturization of a semiconductor device. When thickness of the insulating film is reduced to 3.0 nm or less, there arises a problem in which direct tunnel current (hereinafter referred to as DT current) becomes too large to be ignored, leakage current increases, and electric power consumption increases. Thus, by using as a gate insulating film titanium oxide or the like, having a higher dielectric constant than that of silicon oxide, which leads to improvement in the dielectric characteristics, and, at the same time, increase the thickness of the gate insulating film, a tendency for increase in DT current can be suppressed. For example, when relative dielectric constants of titanium oxide and silicon oxide are respectively 60 and 4.0, it follows that a titanium oxide film of 30 nm in thickness has dielectric characteristics equivalent to those of a silicon oxide film of 2 nm in thickness. In such case, the titanium oxide film of 30 nm in thickness is said to have a silicon-oxide equivalent thickness of 2 nm. On the other hand, the factual thickness of 30 nm is called a physical film thickness or factual film thickness.

On the other hand, when a titanium oxide film is formed on a silicon substrate, in some cases oxygen atoms in the titanium oxide film diffuse to the silicon substrate side to form silicon oxide at the interface between the titanium oxide film and the silicon substrate. The formation of silicon oxide increases the equivalent thickness of a gate insulating film. For example, when silicon oxide is formed at said interface in a thickness of not less than 1 nm, it becomes impossible to have the equivalent thickness of a gate insulating film in the range of not more than 1 nm.

Thus, in order to prevent formation of silicon oxide at said interface, there is contrived a method of forming a silicon nitride film between a titanium oxide film and a silicon substrate (for example, see JP-A-2000-58831). Formation of silicon oxide at said interface can be suppressed by forming a silicon nitride film between a titanium oxide film and a silicon substrate. However, silicon nitride has only a relative dielectric constant of about 7.8, and when a gate insulating film is allowed to have a silicon-oxide equivalent thickness of not more than 1 nm, the factual thickness thereof is decreased and leakage current by direct tunnel is increased. Hence, there is a possibility that leakage current would surpass the acceptable value.

The possibility that leakage current is increased and would surpass the acceptable value reduces yield of products and causes reduction in reliability of the products.

Thus, in order to supply a semiconductor device having high reliability, there is produced a semiconductor device provided with plural MOS transistors each of which has a gate insulating film constituted so as to contain a titanium oxide film, wherein formation of silicon oxide is suppressed at the interface between the titanium oxide film and a silicon substrate, and wherein the gate insulating film is allowed to have a silicon-oxide equivalent thickness of not more than 1 nm.

Alternatively, there is produced a semiconductor device wherein leakage current flowing through the gate insulating film can be suppressed to a low extent.

Furthermore, there is produced a semiconductor device having a high yield.

The inventors carried out experiments and calculations with various materials and, as a result, have found that when a gate insulating film is constituted by forming a titanium silicate film on the surface of a silicon substrate and forming thereon a titanium oxide film, diffusion of oxygen atoms from the titanium oxide film to the silicon substrate can be prevented, and leakage current can be reduced effectively because the relative dielectric constant of titanium silicate is larger than that of silicon nitride.

(4) The present invention resolving the above problems provides for a semiconductor device comprising plural MOS transistors each of which has a gate insulating film disposed between a semiconductor substrate and a gate electrode, characterized by the fact that said gate insulating film has a laminated structure containing a titanium silicate film formed on the semiconductor substrate side and a titanium oxide film formed on the gate electrode side.

In this case, it is desirable that the silicon-oxide equivalent thickness of said gate insulating film which is obtained from dielectric characteristics, is not more than 1.0 nm, and that said titanium silicate film has a factual thickness of not less than 1.0 nm but not more than 3.2 nm.

Actually, it is desirable that a factual thickness, $T_2$, of said titanium silicate film is formed to fall within a range represented by $$1.0 \text{ (nm)} \leq T_2 \leq 5T_{\mathit{eff}} - 1.8 \text{ (nm)}$$

wherein $T_2$ represents the factual thickness of said titanium silicate film and $T_{\mathit{eff}}$ represents the silicon-oxide equivalent thickness of said gate insulating film.

(5) Furthermore, in preparing a semiconductor device comprising plural MOS transistors each of which has a gate insulating film present between a semiconductor substrate and a gate electrode, the gate insulating film is formed by a step including a procedure of forming a titanium silicate film on the semiconductor substrate and a procedure of forming a titanium oxide film on the titanium silicate film.

The titanium silicate film can be formed by either a method of forming a titanium film on the surface of a silicon substrate, heat-treating the titanium film into a titanium silicide film, and oxidizing the titanium silicide film into the titanium silicate film, or a method of forming a silicon oxide film on the surface of the silicon substrate, forming a titanium film superposed on the silicon oxide film, and reacting the two by heat treatment to form the titanium silicate film.

The semiconductor device of the present invention has a titanium silicate film at the interface between titanium oxide and a silicon substrate, and hence formation of a silicon oxide film having a low relative dielectric constant at said interface can be suppressed. Therefore, the silicon-oxide equivalent thickness of a gate insulating film can be reduced.

Furthermore, the present semiconductor device has, as the gate insulating film, titanium oxide which is a high dielectric constant material, and the titanium silicate film having a relatively large dielectric constant. Hence, the factual thickness of the gate insulating film can be increased and the silicon-oxide equivalent thickness thereof can be reduced. Therefore, leakage current can be reduced.

Moreover, because a semiconductor device wherein leakage current is difficult to flow can be obtained, there can be produced a semiconductor device having high reliability and, also, having a high yield.

Other objects, characteristics and advantages of the present invention will be clear from the following description of the working embodiments of the present invention relating to the attached drawings.

BRIEF DESCRIPTION OF DRAWINGS

FIG. 8 shows diffusion constants at 300° C. of oxygen diffusing from a titanium oxide film of rutile structure having a thickness of 0.9 nm to capacitor electrodes of 0.8 nm in thickness with regard to the present invention.

FIG. 9 shows diffusion constants at 300° C. of oxygen diffusing from a titanium oxide film of rutile structure having a thickness of 0.8 nm to capacitor electrodes of 0.9 nm in thickness with regard to the present invention.

DETAILED DESCRIPTION OF THE EMBODIMENTS

Figure 1:
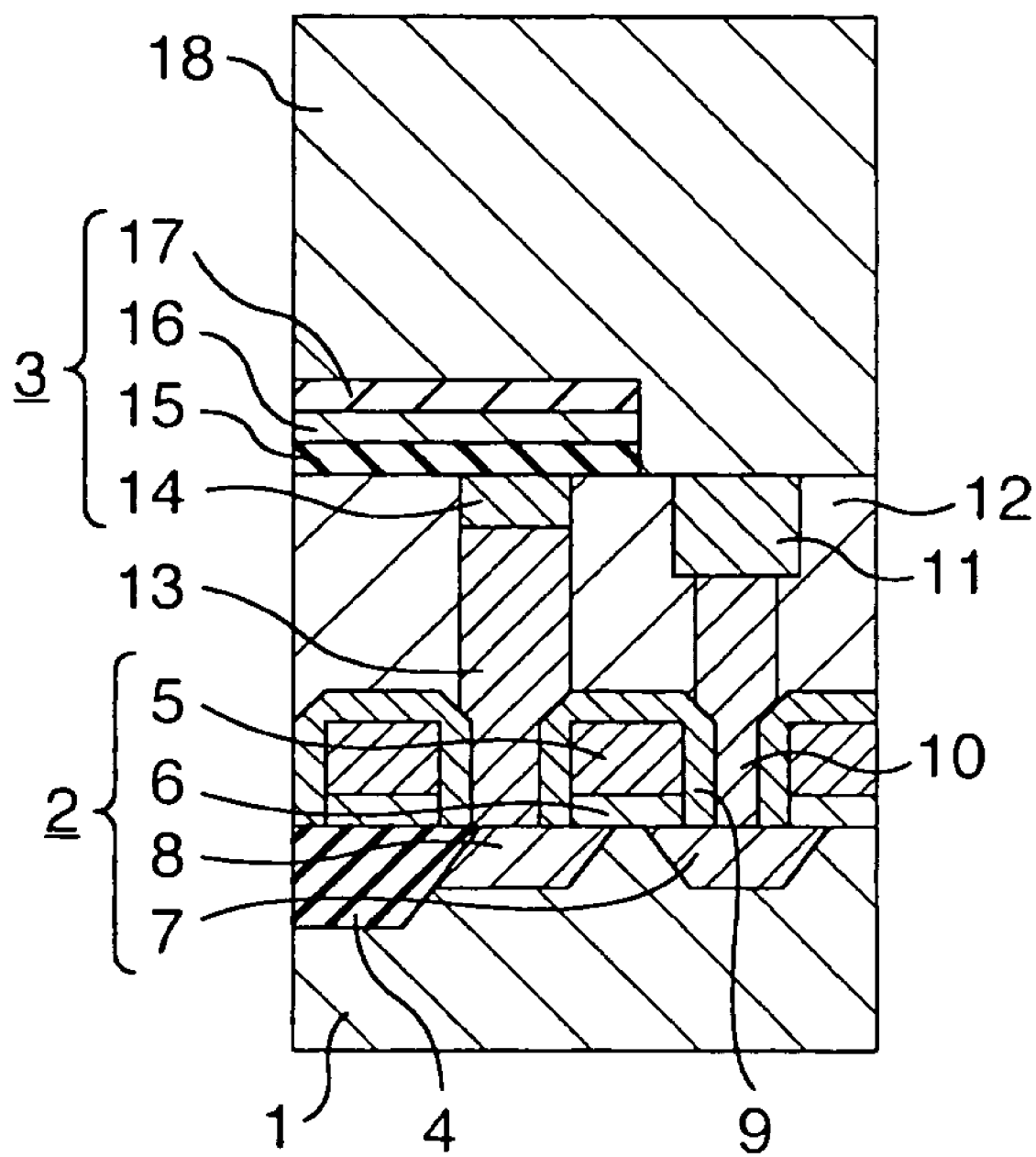
FIG. 1 is the sectional view of the main portion of a semiconductor device according to a first example of the present invention.

Hereinafter, the mode for carrying out the present invention will be described in detail. First, the sectional structure of the main portion of a DRAM (Dynamic Random Access Memory) memory cell which is the first example in the present invention, is shown in FIG. 1. As shown in FIG. 1, the semiconductor device of the present example is provided with MOS (Metal Oxide Semiconductor) type transistors 2 formed on a silicon substrate 1 which is a semiconductor, and a memory capacitor 3 disposed above the transistors. An insulating film 12 is a film for separating elements. In this connection, structures of the present figure and the other figures are schematically shown in order to help in the understanding of the present examples including the circuits thereof and which are mere examples.

The MOS transistor 2 in the memory cell is constituted by a gate electrode 5, a gate insulating film 6 and diffusion layers 7. The gate insulating film 6 consists of, for example, silicon oxide film, silicon nitride film or a high dielectric constant film or a laminated structure thereof. The gate electrode 5 consists of, for example, polycrystalline silicon film or metal thin film, conductive oxide film or metal silicide film or a laminated structure thereof. On the top and side walls of said gate electrode 5, there is formed an insulating film 9 consisting of, for example, silicon oxide film. The one diffusion layer 7 of the MOS transistor for memory cell selection is connected to a bit-line 11 through a plug 10. In the whole portion above the MOS transistors, there is formed an insulating film 12 consisting of, for example, BPSG (Boron-doped Phospho Silicate Glass) film or SOG (Spin On Glass) film, or silicon oxide or nitride film formed by chemical vapor phase deposition method or sputtering method, or the like.

A memory capacitor 3 is formed on the insulating film 12 covering the MOS transistors. The memory capacitor 3 is connected to the other diffusion layer 8 of the MOS transistor for memory cell selection through a plug 13 consisting of, for example, polycrystalline silicon or tungsten or the like. The memory capacitor 3 is constituted by a laminated structure of a conductive barrier film 14, a capacitor lower electrode 15, a capacitor insulating film 16 consisting mainly of titanium oxide, and a capacitor upper electrode 17 in the order from the lowermost layer. This memory capacitor 3 is covered by an insulating film 18. The conductive barrier film 14 consists of, for example, titanium, titanium nitride, tantalum, tantalum nitride or the like. In this connection, the conductive barrier film 14 may be absent, for example, in the case where adhesion between the capacitor lower electrode 15 and the plug 13 is good and, furthermore, their counter diffusion scarcely takes place.

The inventors have found that when as a material for the capacitor lower electrode 15 and the capacitor upper electrode 17 there is used polycrystalline silicon, tungsten, tungsten silicide, molybdenum, molybdenum silicide, ruthenium, iridium, platinum or the like, oxygen diffuses to the capacitor electrodes from the capacitor insulating film 16 comprising mainly titanium oxide, and oxygen deficit is caused in the capacitor insulating film 16, and, furthermore, the inventors have found that the dielectric constant is not stable because of this oxygen deficit. Moreover, the inventors carried out intense research in order to obtain a means for suppressing diffusion of oxygen to a capacitor electrode from a capacitor insulating film comprising mainly titanium oxide, and, as a result, they have found that it is effective to use ruthenium oxide or iridium oxide as a capacitor electrode material which contacts with titanium oxide. Thus, in the present example, a conductive oxide film comprising mainly ruthenium oxide or iridium oxide is used for the capacitor lower electrode 15 and the capacitor upper electrode 17 so that oxygen hardly diffuses to the electrodes from the capacitor insulating film 16 comprising mainly titanium oxide. This conductive oxide film is formed by use of, for example, chemical vapor phase deposition method, sputtering method or the like.

With regard to diffusion of oxygen from titanium oxide to electrodes, by comparing ruthenium oxide and iridium oxide used in the present example with polycrystalline silicon, tungsten, tungsten silicide, molybdenum, molybdenum silicide, ruthenium, iridium, and platinum, which have been considered as a capacitor electrode material, the effect of the present example is illustrated as follows.

In order to explain the effect of the present example in detail, there is shown an analytical example based on molecular dynamics simulation. The molecular dynamics simulation is a method of calculating a force acting on each atom through interatomic potential, and calculating position of each atom at each time by resolving Newton's equation of motion on the basis of said force, as stated in, for example, Journal of Applied Physics, Vol. 54 (issued in 1983), pages 4864–4878. In this connection, in the present example, the below-mentioned relation could be obtained by taking into account charge-transfer in said molecular dynamics method and calculating the interaction between different elements.

The main effect of the present example is to suppress diffusion of oxygen from a capacitor insulating film to capacitor electrodes. Diffusion of other elements is also suppressed, but herein the effect of the present example is illustrated by calculating diffusion constants of oxygen, which diffuses to capacitor electrodes, and comparing the calculation results. The method for calculating diffusion constants by the molecular dynamics simulation is stated in, for example, Physical Review B, Vol. 29 (issued in 1984), pages 5363–5371.

First, the effect of the present example is shown by use of a calculation example in the case of using a laminated structure of a capacitor electrode having a film thickness of 3 nm and a capacitor insulating film having a thickness of 3 nm. As the capacitor insulating film, there was used a titanium oxide film of rutile structure or anatase structure, and as the capacitor electrode material there were used polycrystalline silicon, tungsten, tungsten silicide, molybdenum, molybdenum silicide, ruthenium, iridium, and platinum, which have been considered as a capacitor electrode, and ruthenium oxide and iridium oxide used in the present example.

Figure 2:
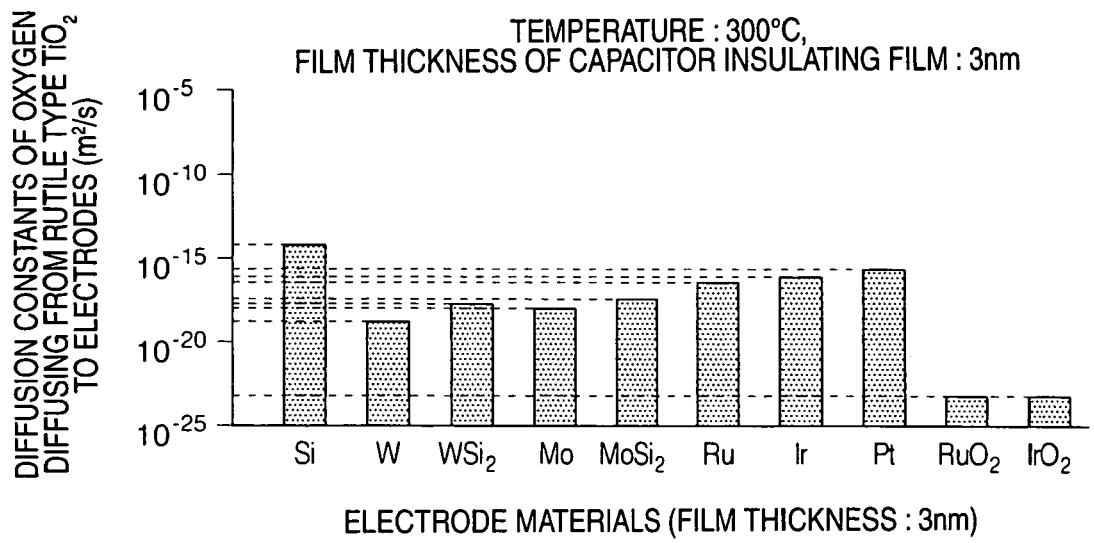
FIG. 2 shows diffusion constants at 300° C. of oxygen diffusing from a titanium oxide film of rutile structure having a thickness of 3 nm to capacitor electrodes of 3 nm in thickness with regard to the present invention.
Figure 3:
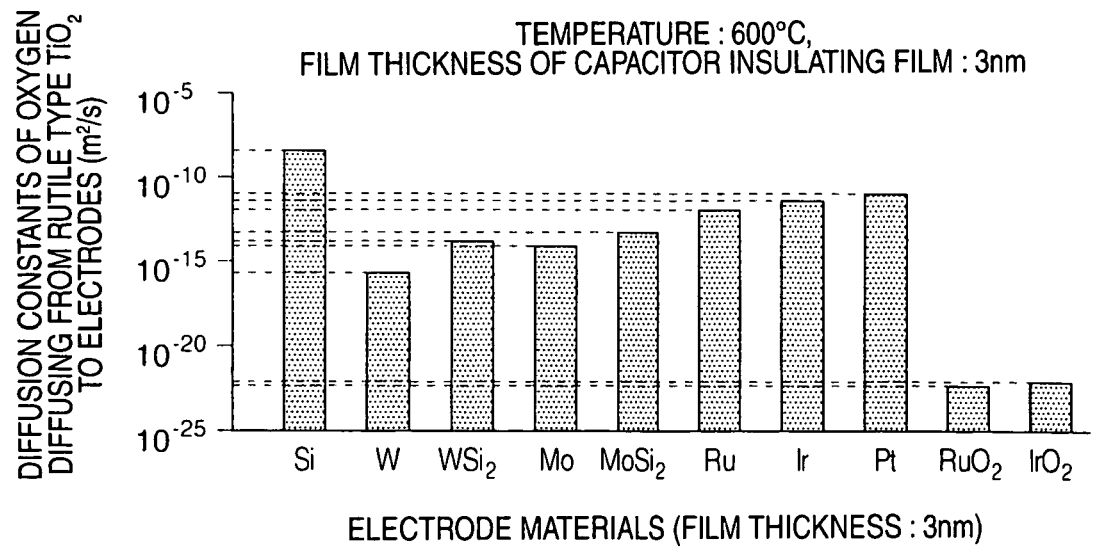
FIG. 3 shows diffusion constants at 600° C. of oxygen diffusing from a titanium oxide film of rutile structure having a thickness of 3 nm to capacitor electrodes of 3 nm in thickness with regard to the present invention.

Calculation results of diffusion constants, when oxygen diffuses to the electrodes from the titanium oxide film of rutile structure at 300° C., are shown in FIG. 2. Moreover, diffusion constants at 600° C. are shown in FIG. 3.

When diffusion constants at 300° C. are not less than $10^{-20}$ m$^2$/s, much oxygen deficit is formed in the capacitor insulating film. Hence, in order to ensure the reliability of a semiconductor device such as shown in FIG. 1, it is preferable that diffusion constants at 300° C. are less than $10^{-20}$ m$^2$/s.

Figure 4:
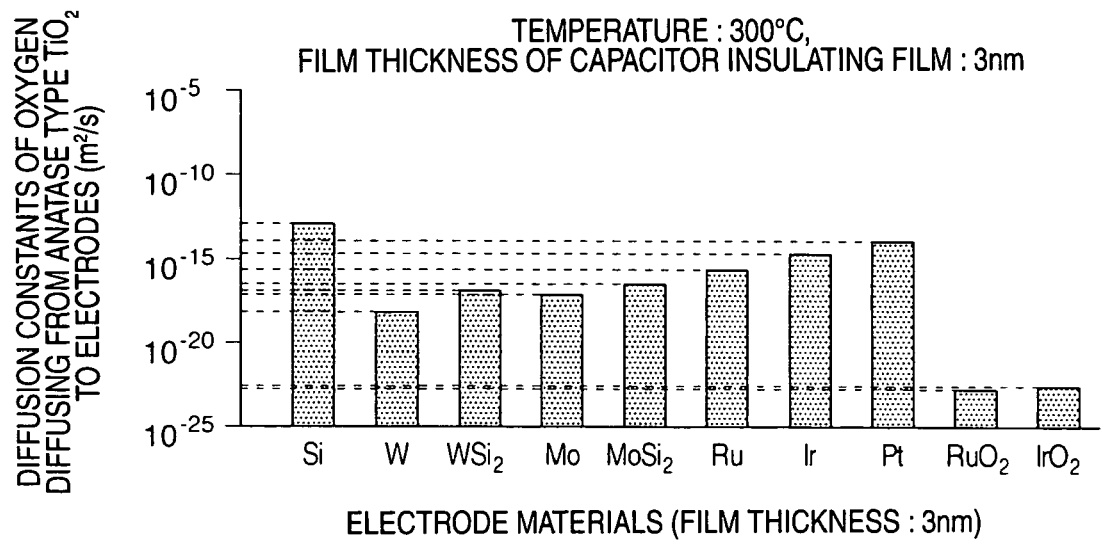
FIG. 4 shows diffusion constants at 300° C. of oxygen diffusing from a titanium oxide film of anatase structure having a thickness of 3 nm to capacitor electrodes of 3 nm in thickness with regard to the present invention.
Figure 5:
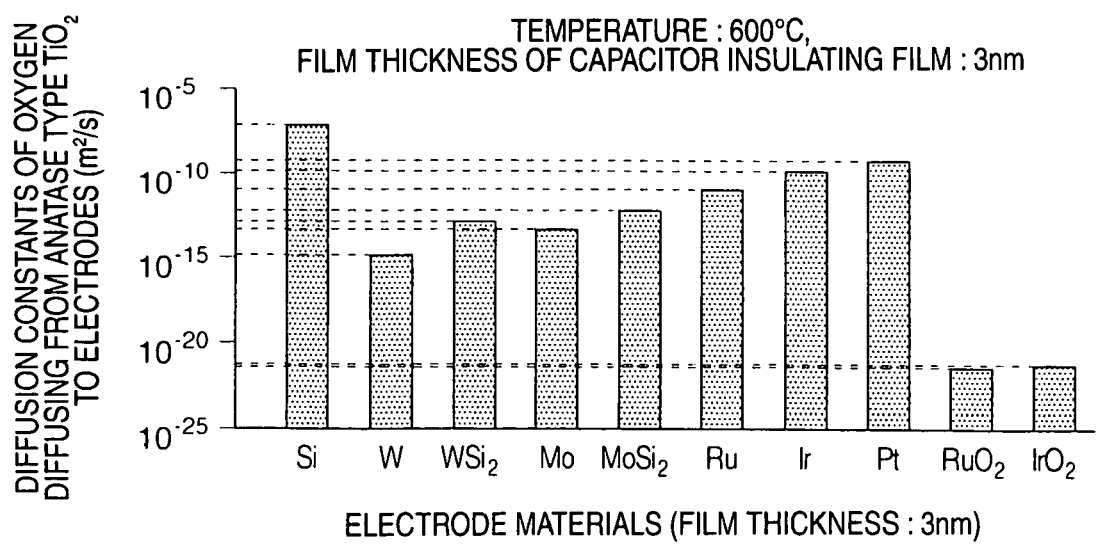
FIG. 5 shows diffusion constants at 600° C. of oxygen diffusing from a titanium oxide film of anatase structure having a thickness of 3 nm to capacitor electrodes of 3 nm in thickness with regard to the present invention.

From these figures it is seen that when ruthenium oxide or iridium oxide was used as an electrode in the cases of both 300° C. and 600° C., smaller diffusion constants are shown as compared with the other cases. That is, when ruthenium oxide or iridium oxide was used as an electrode, it can be said that oxygen hardly diffuses to the electrode and reliability is high. FIG. 2 and FIG. 3 show calculation results in the case of using titanium oxide of rutile structure, but calculation results of diffusion constants in the case of using titanium oxide having anatase structure are as shown in FIG. 4 and FIG. 5. FIG. 4 and FIG. 5 show calculation results respectively at 300° C. and 600° C. Also in these figures, similarly to FIG. 2 and FIG. 3, when ruthenium oxide or iridium oxide was used as an electrode, smaller diffusion constants are shown as compared with the other cases. When calculation results of FIG. 4 and FIG. 5 are compared with those of FIG. 2 and FIG. 3, it is seen that diffusion constants in the case of using rutile structure are smaller than in the case of anatase structure. Therefore, it is more preferable to use titanium oxide of rutile structure as a capacitor insulating film and use ruthenium oxide or iridium oxide as a capacitor electrode. The titanium oxide of rutile structure is formed by a method of film formation at a high temperature or film formation at a low temperature and the subsequent heat treatment as stated in, for example, IBM Journal of Research and Development, Vol. 43, No. 3 (issued in May 1999), pages 383–391.

FIG. 2, FIG. 3, FIG. 4 and FIG. 5 show calculation results when 3 nm was selected as the thickness of a capacitor electrode film and that of a capacitor insulating film, but in order to study dependency of diffusion constant on film thickness, results obtained by changing these thicknesses are shown hereinafter. When 0.9 nm was selected as both the thickness of a capacitor electrode film and that of a capacitor insulating film, calculation results at 300° C. for rutile structure and anatase structure are shown respectively in FIG. 6 and FIG. 7.

Figure 6:
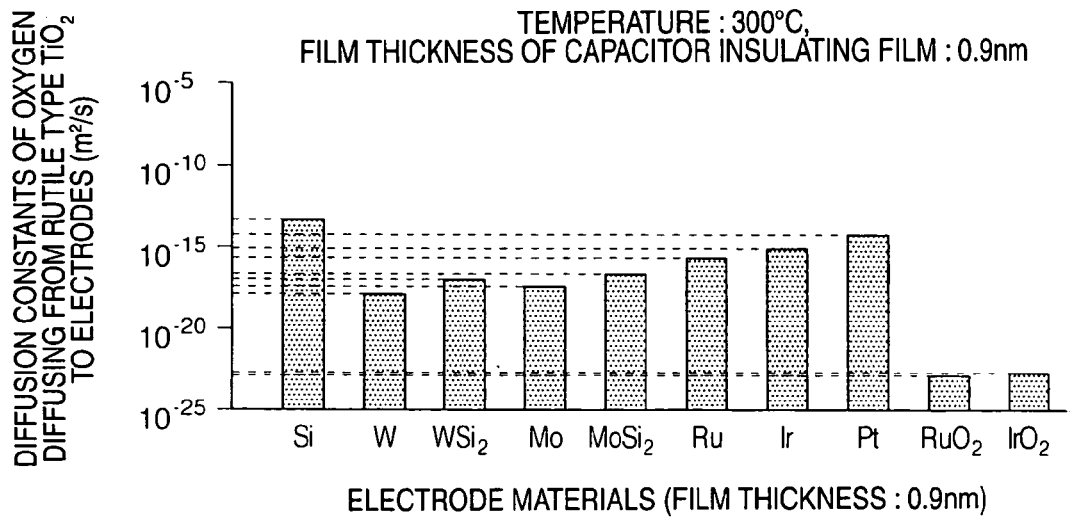
FIG. 6 shows diffusion constants at 300° C. of oxygen diffusing from a titanium oxide film of rutile structure having a thickness of 0.9 nm to capacitor electrodes of 0.9 nm in thickness with regard to the present invention.
Figure 7:
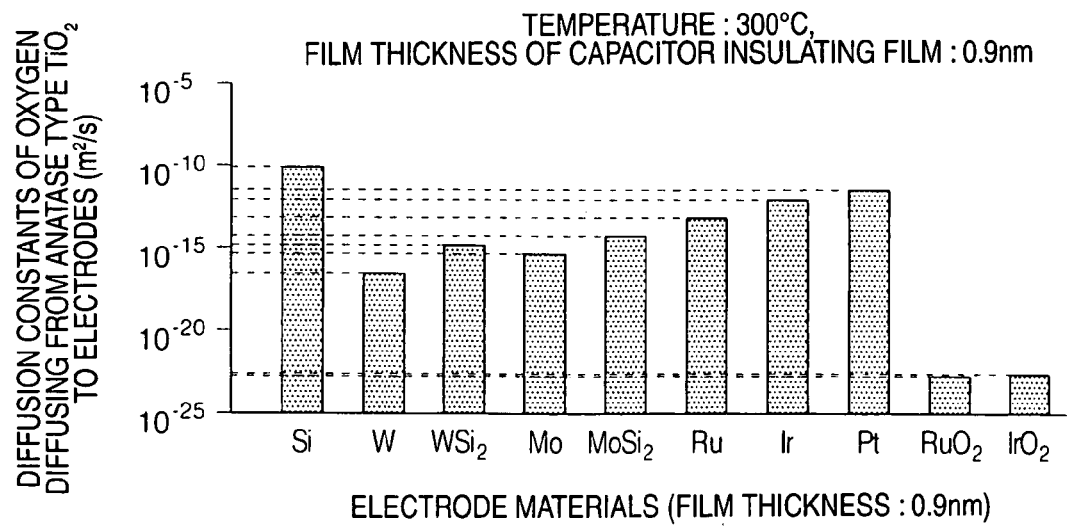
FIG. 7 shows diffusion constants at 300° C. of oxygen diffusing from a titanium oxide film of anatase structure having a thickness of 0.9 nm to capacitor electrodes of 0.9 nm in thickness with regard to the present invention.

From FIG. 6 and FIG. 7, similarly to the case of 3 nm film thickness, even when the film thickness is reduced to 0.9 nm, it is seen that diffusion constants for ruthenium oxide and iridium oxide are remarkably small as compared with those for the other materials. Though not shown in the figures, also, in the case of 600° C., there was obtained the result that diffusion constants for ruthenium oxide and iridium oxide are remarkably small as compared with those for the other materials.

On the other hand, when 0.9 nm was retained as the thickness of a capacitor insulating film and 0.8 nm was selected as the thickness of a capacitor electrode film, calculation results for rutile structure at 300° C. are shown in FIG. 8. In this case, when compared with FIG. 6 and FIG. 7, it is seen that diffusion constants for ruthenium oxide and iridium oxide are considerably greater than $10^{-20}$ m$^2$/s, in which the effect of the present example is reduced. Therefore, it is more preferable that the film thickness of ruthenium oxide or iridium oxide is not less than 0.9 nm. Next, when 0.9 nm was retained as the thickness of a capacitor electrode film and 0.8 nm was selected as the thickness of a capacitor insulating film, the calculation results for a rutile structure at 300° C. are shown in FIG. 9.

Also in this case, when compared with FIG. 6 and FIG. 7, it is seen that diffusion constants for ruthenium oxide and iridium oxide are remarkably large and the effect of the present example is reduced. Therefore, it is more preferable, also, that the film thickness of titanium oxide is 0.9 nm or more.

The above phenomenon that diffusion constants become suddenly large when the thickness of an electrode or that of a capacitor insulating film is 0.8 nm or less is considered to occur because of the following reason. The diameter of atoms is approximately 0.1 to 0.3 nm, and 0.8 nm corresponds to the state wherein atoms stand in 4 to 8 lines. In this state, it is presumed that atoms in adjacent films commingle and would lead to a loss of film function.

FIG. 8 and FIG. 9 show results for rutile structure. Similarly, also with regard to anatase structure, there was obtained the result that a film thickness of 0.9 nm or more is more preferable. The effect is reduced in a film thickness of 0.8 nm or less, because crystal structures of ruthenium oxide, iridium oxide and titanium oxide become slightly unstable. In addition, though not shown in FIG. 2 to FIG. 7, when a material of low melting point such as gold or silver is used as an electrode material, diffusion constant of oxygen becomes larger than in the case of using silicon as an electrode. Therefore, it is not preferable either to use gold or silver as an electrode material which contacts with titanium oxide.

Figure 10:
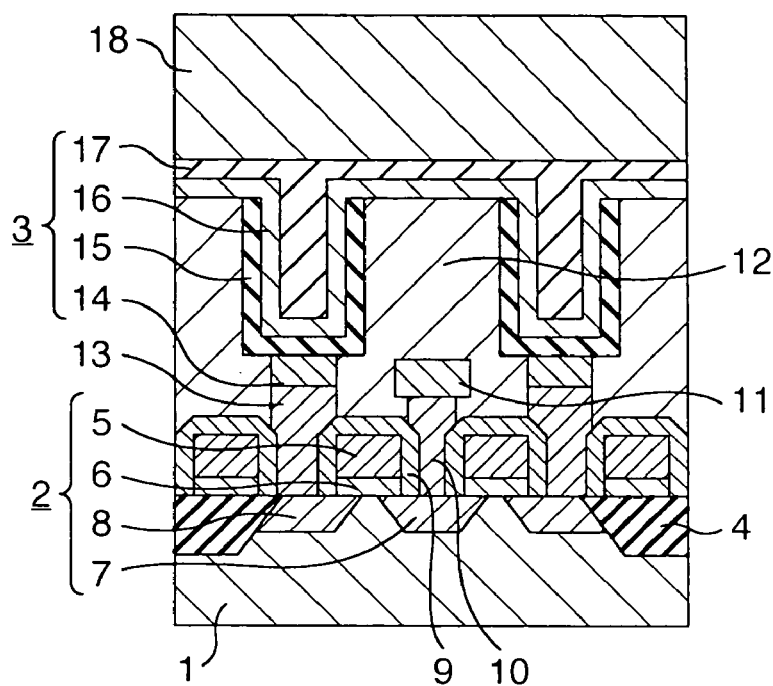
FIG. 10 is the sectional view of the main portion of a semiconductor device according to a second example of the present invention.

Next, the sectional structure of the main portion of a DRAM (Dynamic Random Access Memory) memory cell according to the second example of the present invention is shown in FIG. 10. The main difference from the first example resides in the point that the capacitor has not a parallel-plate structure but a rectangular structure. The use of a same number in FIG. 10 as in FIG. 1 means the same constituent component. This structure has the advantage that the capacitor has a larger effective area and a larger capacity. Also, in the present example, by use of a capacitor electrode consisting mainly of ruthenium oxide or iridium oxide, the suppression effect of oxygen diffusion can be obtained similarly to that in the first example. In addition, the capacitor may have a structure other than these structures.

Figure 11:
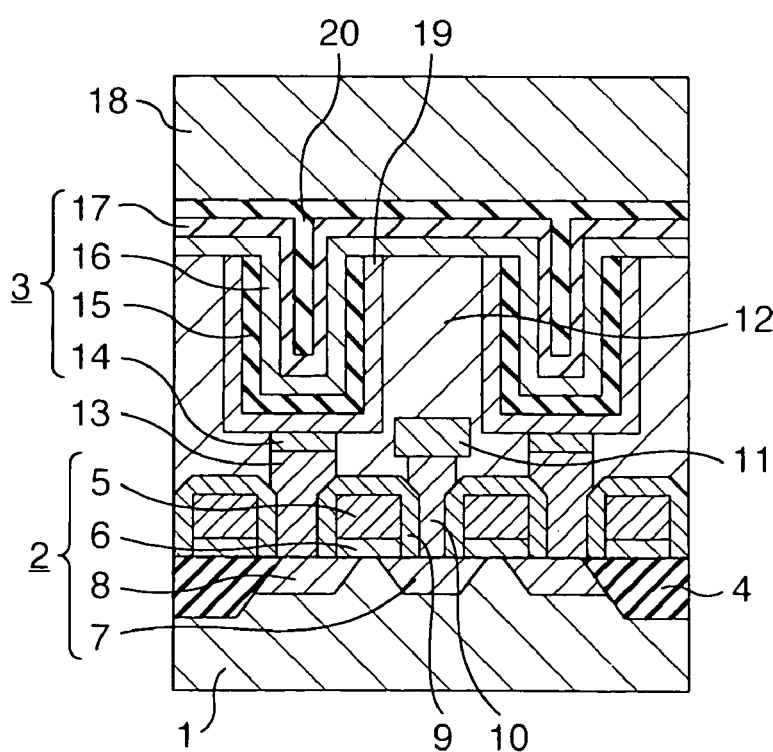
FIG. 11 is the sectional view of the main portion of a semiconductor device according to a third example of the present invention.

Next, the sectional structure of the main portion of a DRAM (Dynamic Random Access Memory) memory cell according to the third example of the present invention is shown in FIG. 11. The main difference from the second example resides in the point that the capacitor electrode has a double structure. That is, the capacitor lower electrode is constituted by a conductive film 15 and a conductive film 19, and the capacitor upper electrode is constituted by a conductive film 17 and a conductive film 20. The use of a same number in FIG. 11 as in FIG. 10 means the same constituent component. In the case of FIG. 11, conductive films 15 and 17, which are in direct contact with the capacitor insulating film 16, consist of a film consisting mainly of ruthenium oxide or iridium oxide in order to suppress diffusion of oxygen from the capacitor insulating film. Electrode films 19 and 20 which do not directly contact with the capacitor insulating film, preferably consist of a material having a lower electric resistance than that of ruthenium oxide or iridium oxide such as ruthenium, iridium, platinum, osmium, rhodium, palladium, tungsten, molybdenum, gold, silver, or the alloys or silicide compounds thereof, or the like. The similar matter is applicable also to the electrodes of the following examples. In addition, an electrode structure is not limited to the structures shown herein, and other layers may be furthermore contained therein. Moreover, only the upper electrode may be formed by plural layers and the lower layer may comprise a single layer. On the contrary, only the lower electrode may be formed by plural layers and the upper layer may comprise a single layer. The similar matter is applicable also to the electrodes of the following examples.

The above examples relate to DRAM (Dynamic Random Access Memory), and for products having a thin film capacitor containing a capacitor insulating film comprising mainly titanium oxide there can be used electrodes comprising mainly ruthenium oxide or iridium oxide.

Figure 12:
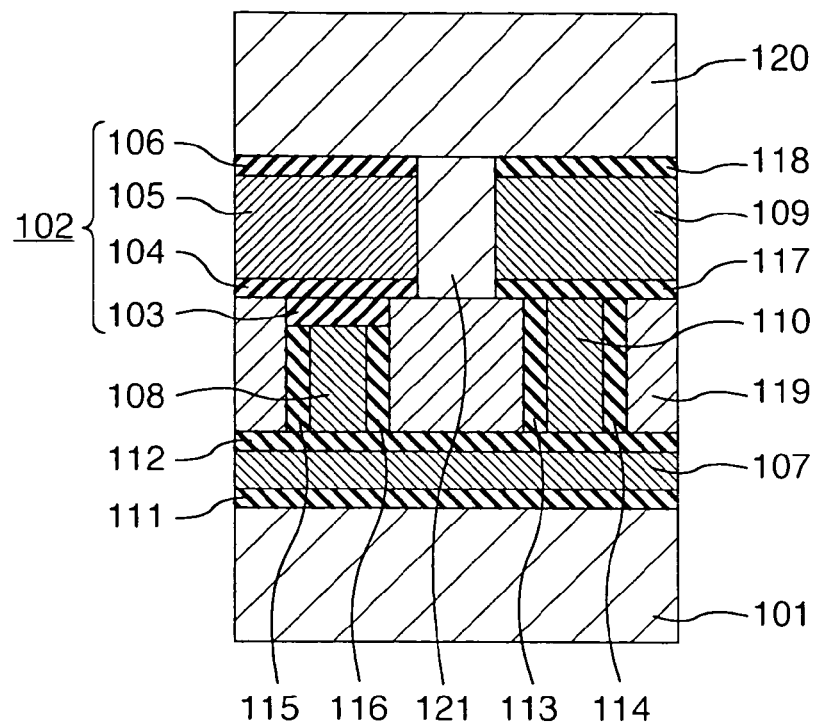
FIG. 12 is the sectional view of the main portion of a thin film capacitor according to a fourth example of the present invention.

Next, a thin film capacitor according to the fourth example of the present invention is described by use of FIG. 12. In the present example, the thin film capacitor 102 is formed on a substrate 101 consisting of, for example, a semiconductor material, a resin, a glass or the like. This thin film capacitor 102 consists of a conductive barrier film 103, a capacitor lower electrode 104, a capacitor insulating film 105 comprising mainly titanium oxide, and a capacitor upper electrode 106 in the order from the lowermost layer.

The conductive barrier film 103 consists of titanium, titanium nitride, tantalum, tantalum nitride or the like. As the main constituent material of the capacitor lower electrode 104 and the capacitor upper electrode 106, there is used ruthenium oxide or iridium oxide to which oxygen hardly diffuses from the capacitor insulating film 105. The thin film capacitor 102 is connected to a first layer wire 107 through a plug 108 consisting of, for example, copper, tungsten or the like.

A second layer wire 109 is connected to the first layer wire 107 through a plug 110. In addition, though not shown in the figure, the second layer wire 109 and the capacitor upper electrode 106 are connected to another wire. Barrier films 111, 112, 113, 114, 115, 116, 117, and 118 are adjacent to the first layer wire 107, second layer wire 109, plug 108 and plug 110. When the first layer wire 107, second layer wire 109, and plug 108 have excellent adhesion with an insulating film 119 and, furthermore, hardly cause interdiffusion with the insulating film 119, these barrier films may be absent. 120 and 121 are insulating films. The thin film capacitor 102 is used, for example, as a filter for flowing only alternating electric current of a specific range of frequency to the second layer wire.

Figure 13:
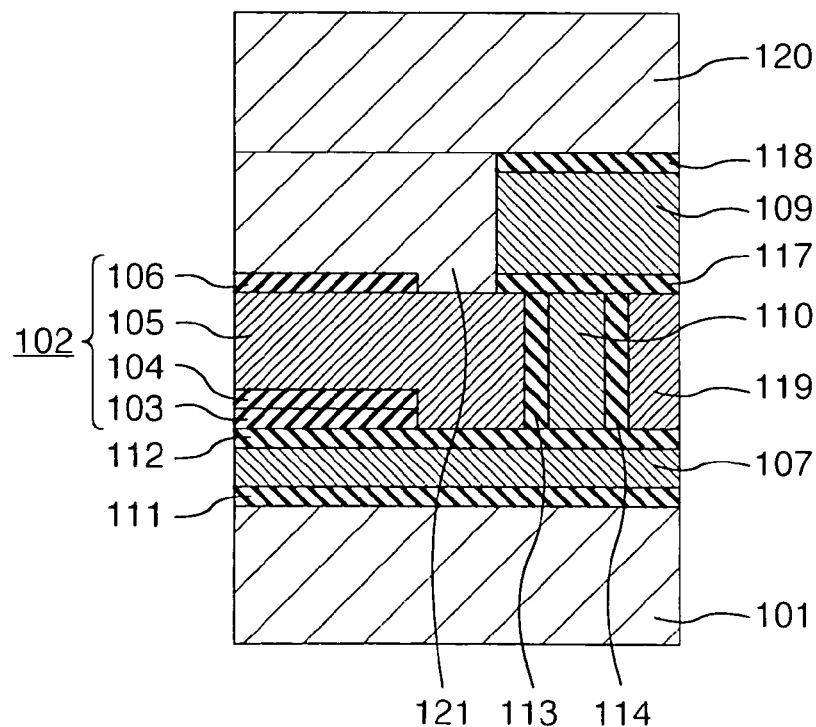
FIG. 13 is the sectional view of the main portion of a thin film capacitor according to a fifth example of the present invention.

Subsequently, a thin film capacitor according to the fifth example in the present invention is described by use of FIG. 13. The main difference between the present example and the fourth example resides in the point that, in the latter, the capacitor insulating film comprising mainly titanium oxide is used as an insulating film between the first layer wire and second layer wire, and the structure of the present example is simple. In addition, the use of a same number in FIG. 13 as in FIG. 12 means the same constituent component. According to the present example, the number of film formation steps can be reduced.

Figure 14:
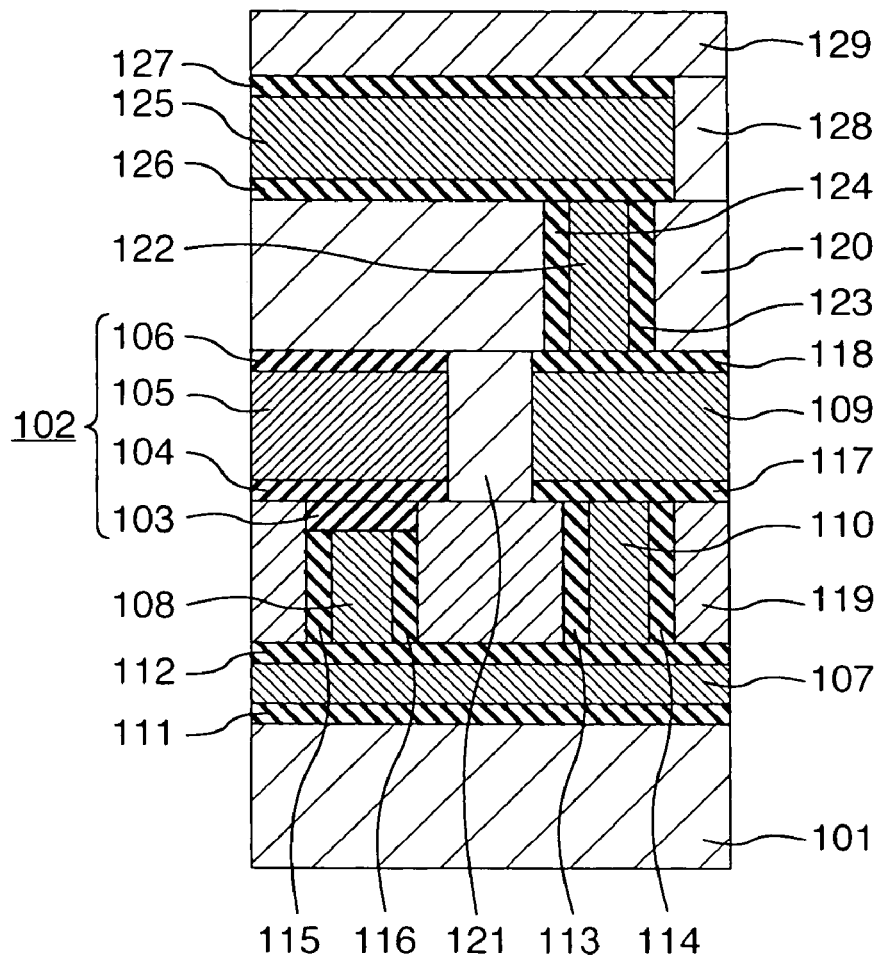
FIG. 14 is the sectional view of the main portion of a thin film capacitor according to a sixth example of the present invention.

Furthermore, the layout of a thin film capacitor is not limited to that as above-described. For example, even the layout as shown in FIG. 14 is usable. The main difference between the sixth example and the fourth example resides in the point that, in the latter, the thin film capacitor 102 is positioned at a layer between the second layer wire 109 and a third layer wire 125. The use of a same number in FIG. 14 as in FIG. 12 means the same constituent components. In FIG. 14, further, reference numerals 123, 124, 126 and 127 are barrier films, 122 is a plug for interconnecting wires 109 and 125, and reference numerals 128 and 129 are insulating films.

Figure 15:
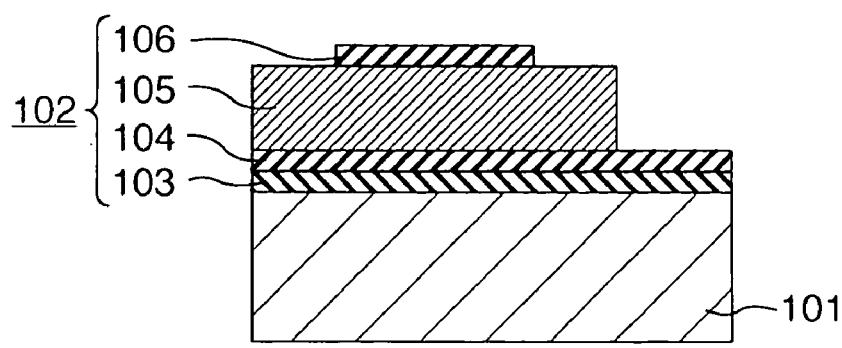
FIG. 15 is the sectional view of the main portion of a thin film capacitor according to a seventh example of the present invention.

In addition, as a simpler example, there is cited the layout as shown in FIG. 15. The seventh example has the structure wherein a thin film capacitor 102 is formed on one main surface of a substrate 101 comprising, for example, silicon or the like. The thin film capacitor 102 comprises a conductive barrier film 103, a capacitor lower electrode 104, a capacitor insulating film 105 comprising mainly titanium oxide, and a capacitor upper electrode 106 in the order from the lowermost layer. The conductive barrier film 103 comprises, for example, titanium nitride, titanium or the like. In addition, though not shown in the figure, there may be present a single or plural other films between the barrier film 103 and the substrate 101.

Figure 16:
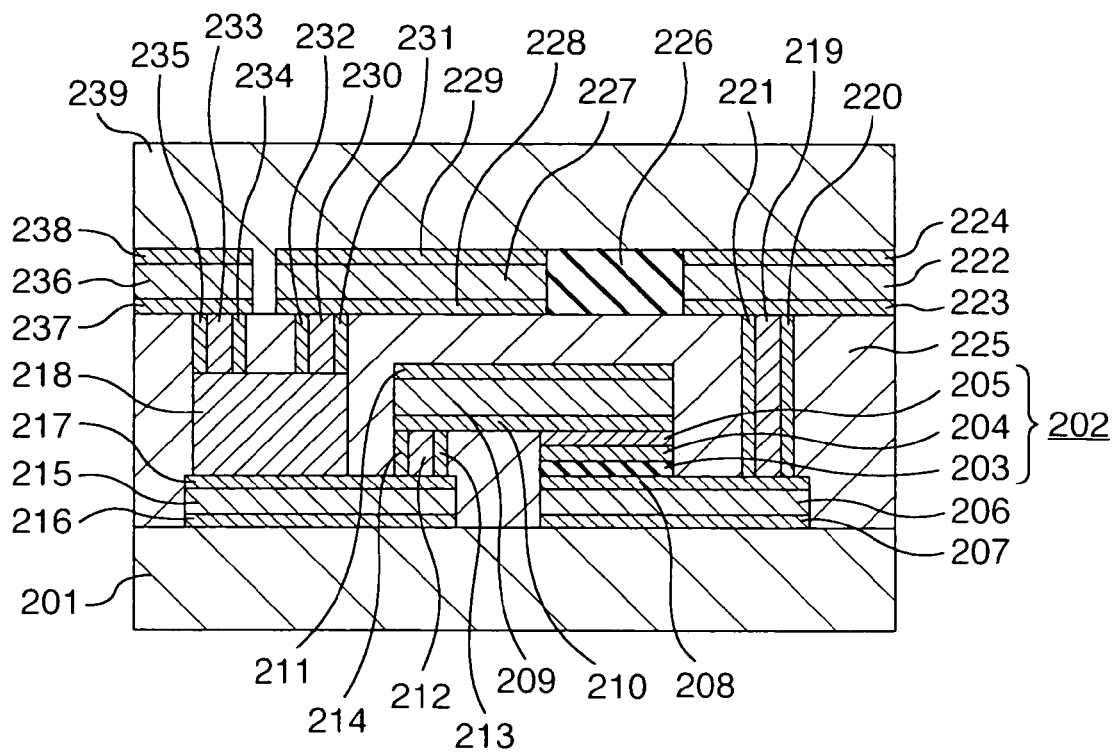
FIG. 16 is the sectional view of the main portion of a system-in-package according to an eighth example of the present invention.

Subsequently, the main sectional view of a system-in-package according to the eighth example of the present invention is shown in FIG. 16. The system-in-package is the one wherein a LSI (Large Scale Integrated Circuit) and passive elements are integrated on a substrate, as stated in, for example, Nikkei Micro-device, March 2001, pages 114–123. In the present example, a LSI 218, a thin film capacitor 202, and a resistance 226 are formed on a substrate 201 consisting of, for example, a resin, an organic material, a glass, silicon or the like. The thin film capacitor 202 consists of a capacitor lower electrode 203, a capacitor insulating film 204 comprising mainly titanium oxide, and a capacitor upper electrode 205 in the order from the lowermost layer. As the main constituent material of the capacitor lower electrode 203 and the capacitor upper electrode 205, there is used ruthenium oxide or iridium oxide to which oxygen hardly diffuses from the capacitor insulating film 204. The capacitor lower electrode 203 of this thin film capacitor 202 is connected to a wire 206 interposed between barrier films 207 and 208. In this connection, when the wire 206 is comprised mainly of copper, it is preferable in the point of preventing the wire from peeling to use ruthenium or iridium as the main constituent material of the barrier film 208. This is because the adhesion between copper and ruthenium and that between copper and iridium are excellent. Furthermore, ruthenium and iridium have good adhesion, also, with ruthenium oxide or iridium oxide, either of which may be used as the main constituent material of the capacitor lower electrode 203, and hence there is obtained a structure which is hard to delaminate. This can similarly be said regarding the capacitor upper electrode 205. That is, the capacitor upper electrode 205 is connected to a wire 209 interposed between barrier films 210 and 211, and hence it is preferable in the point of preventing the wire from peeling to use ruthenium or iridium as the main constituent material of the barrier film 210. In FIG. 16, reference numerals 212, 215, 219, 222, 227, 230, 233 and 236 show wires comprising mainly, for example, copper, and 213, 214, 216, 217, 220, 221, 223, 224, 228, 229, 231, 232, 234, 235, 237 and 238 show barrier films comprising mainly, for example ruthenium. In addition, 225 and 239 show an insulating layer consisting of, for example, a resin or the like. The thin film capacitor 202 is used, for example, as a filter for flowing only alternating electric current of a specific range of frequency to the resistance 226 and wire 227 among electric current flowing to the wire 222. In place of this thin film capacitor 202, there may be used a thin film capacitor formed on a substrate as shown in the seventh example.

In addition, though not shown in the figure, in some cases a memory chip such as ROM, RAM or the like may be provided in this system-in-package. There is the effect that since miniaturization of a capacitor is possible, flexibility in the layout of the capacitor is increased in designing complicated wiring.

Figure 17:
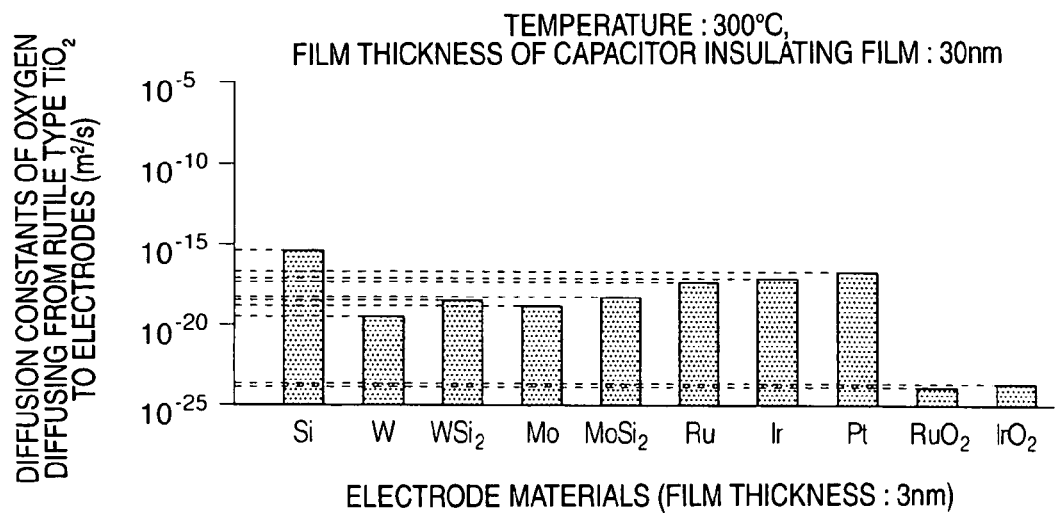
FIG. 17 shows diffusion constants at 300° C. of oxygen diffusing from a titanium oxide film of rutile structure having a thickness of 30 nm to capacitor electrodes of 3 nm in thickness with regard to the present invention.
Figure 18:
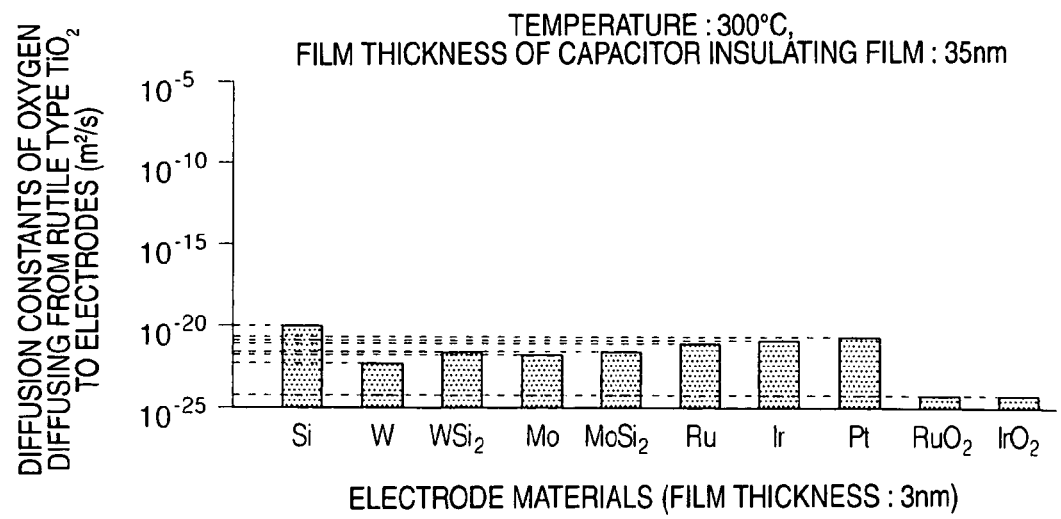
FIG. 18 shows diffusion constants at 300° C. of oxygen diffusing from a titanium oxide film of rutile structure having a thickness of 35 nm to capacitor electrodes of 3 nm in thickness with regard to the present invention.

Furthermore, in order to consider in more detail the dependency of effect on film thickness, similarly to that shown in FIG. 2 to FIG. 9, diffusion constants of oxygen when the thickness of the capacitor insulating film was changed to 30 nm are shown in FIG. 17. Moreover, diffusion constants of oxygen when the thickness of the capacitor insulating film was changed to 35 nm, are shown in FIG. 18. According to FIG. 17, when the thickness of the capacitor insulating film was changed to 30 nm, in the case of using electrode materials other than ruthenium oxide and iridium oxide, the diffusion constants at 300° C. become $10^{-20}$ $m^2/s$ or more. On the other hand, according to FIG. 18, when the thickness of the capacitor insulating film was changed to 35 nm, even in the case of using electrode materials other than ruthenium oxide and iridium oxide, the diffusion constants at 300° C. become smaller than $10^{-20}$ $m^2/s$. When diffusion constants at 300° C. are $10^{-20}$ $m^2/s$ or more, much lack of oxygen is caused in the capacitor insulating film. Hence, in order to ensure reliability of a semiconductor device such as shown in FIG. 1, it is preferable that diffusion constants at 300° C. are smaller than $10^{-20}$ $m^2/s$. According to FIG. 17 and FIG. 18, when the thickness of the capacitor insulating film is smaller than 35 nm, it is more important to use ruthenium oxide or iridium oxide as an electrode material. In addition, even when 3 nm was retained as the thickness of the capacitor insulating film and the thickness of the electrode films was increased to 30 nm or 35 nm, there was obtained almost the same result as in FIG. 2. That is, even when the thickness of the electrode films is increased, in the case of using electrode materials other than ruthenium oxide and iridium oxide, diffusion constants at 300° C. become $10^{-20}$ m²/s or more.

According to the above-mentioned first to eighth examples, there can be provided a thin film capacitor having high reliability. Furthermore, there can be provided a system-in-package having high reliability.

Hereinafter, other examples of the present invention will be described in detail.

Figure 19:
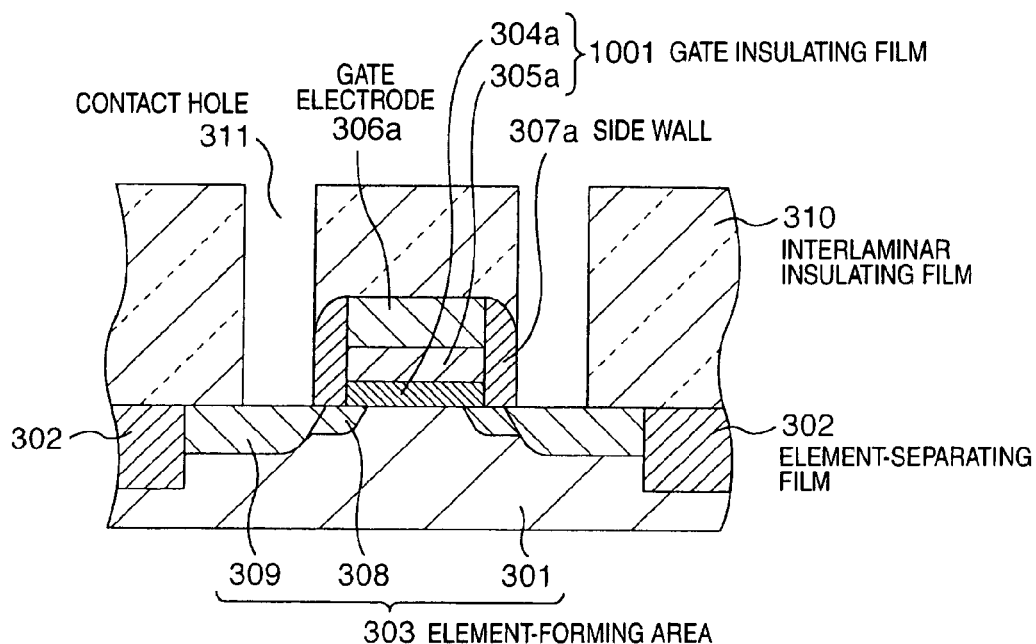
FIG. 19 is the sectional view of the main portion of a semiconductor device according to a ninth example of the present invention.
Figure 20:
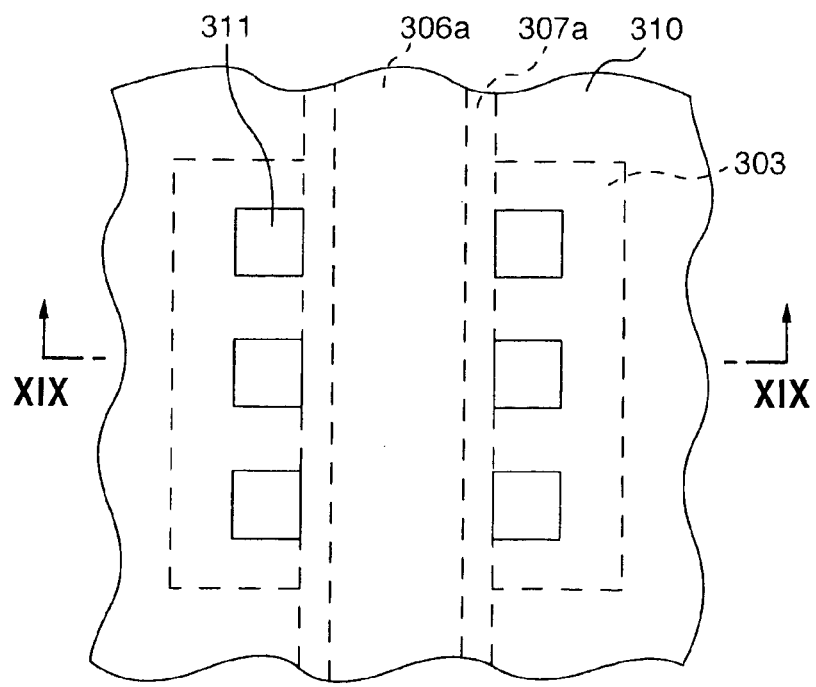
FIG. 20 is the plan view showing the main portion of the semiconductor device of the example shown in FIG. 19.

The plan layout of a semiconductor device according to the ninth working embodiment of the present invention is shown in FIG. 20. FIG. 19 is the sectional view showing the sectional structure cut along the line XIX—XIX of the semiconductor device shown in FIG. 20. In the semiconductor device of the present working embodiment, as shown in FIG. 19, element-separating films 302 consisting of, for example, silicon oxide films are provided at a certain interval on the surface of a P type silicon substrate 301, and an element-forming area 303 is formed between the element-separating films 302. On the element-forming area 303, there is provided a P channel MOS transistor.

The MOS transistor is constituted by containing a gate insulating film 1001 formed on the surface of the silicon substrate 301 and a gate electrode 306a facing the silicon substrate 301 through the gate insulating film 1001. At both sides corresponding to said element-separating film sides of the gate electrode 306a and gate insulating film 1001, there are formed side walls 307a consisting of, for example, silicon nitride. The gate insulating film 1001 is constituted by containing at least a two layer-laminated structure consisting of a titanium silicate film 304a at the silicon substrate side and a titanium oxide film 305a at the gate electrode film side. The gate electrode 306a consists of, for example, a polycrystalline silicon film, a metal thin film, a metal silicide film or the laminated structure thereof.

The MOS transistor shown in the figure has a P-type source-drain diffusion layer 308 formed in the state of self-aligning to the gate electrode 306a and a P+ type source-drain diffusion layer 309 formed in the state of self-aligning to the element-separating film 302 and gate electrode 306a.

On the surface of this semiconductor device, there is formed an interlaminar insulating film 310, and in this interlaminar insulating film 310 there is provided a contact hole 311 leading to the P+ type source-drain diffusion layer 309.

In order to satisfy the demand for miniaturization of transistors, the factual thickness of the titanium silicate film 304a is the one which should give the silicon-oxide equivalent thickness of the gate insulating film 1001 of not more than 1 nm and which should prevent increase of leakage current. For example, when the silicon-oxide equivalent thickness of the gate insulating film 1001 is 1 nm and the electric voltage applied to the gate insulating film is 1 V, the factual thickness of the titanium silicate film 304a should be not less than 1.0 nm but not more than 3.2 nm. Thereby, there can be obtained a gate insulating film wherein leakage current is suppressed to a low level.

Next, a process for deriving the thickness of a titanium silicate film effective for suppressing increase of leakage current will be described.

Figure 21:
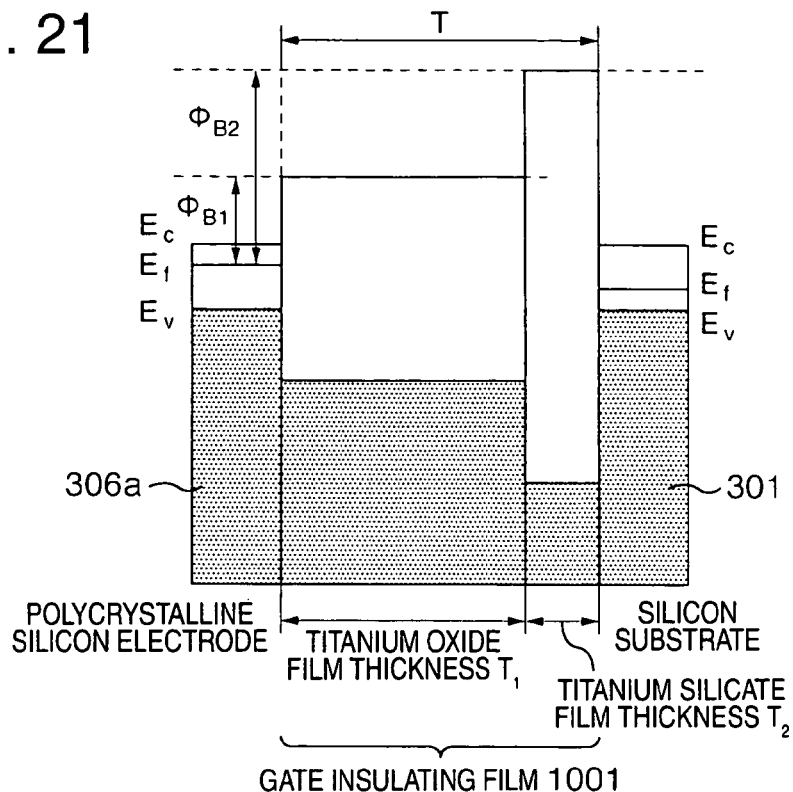
FIG. 21 is the conceptual diagram showing energy bands of the gate electrode, titanium oxide, titanium silicate and silicon substrate in the example shown in FIG. 19.

FIG. 21 shows energy bands of the gate electrode, gate insulating film, and silicon substrate of the MOS transistor shown in FIG. 19. Herein, for example, the gate electrode consists of polycrystalline silicon doped with phosphorus. The gate insulating film consists of a two-layer structure of titanium oxide film of thickness $T_1$ and titanium silicate film of thickness $T_2$, and the titanium silicate film is formed on the silicon substrate side. In addition, the silicon substrate is a P type substrate. Ev, Ec, and Ef in the figure mean, respectively, valence electron band, conduction band, and Fermi energy of silicon. $\Phi_{B1}$ and $\Phi_{B2}$ mean energy barriers of titanium oxide and titanium silicate.

When relative dielectric constants of silicon oxide, titanium oxide, and titanium silicate are respectively $\varepsilon_{SiO2}$, $\varepsilon_1$, and $\varepsilon_2$, silicon-oxide equivalent thicknesses $T_{1eff}$, $T_{2eff}$ and $T_{eff}$ of said titanium oxide film, titanium silicate film, and the gate insulating film consisting of the two layer-structure there of are respectively represented by the following Expression 1, Expression 2, and Expression 3.

$$T_{1eff} = \frac{\varepsilon_{SiO2}}{\varepsilon_1} T_1 \qquad \text{(Expression 1)}$$

$$T_{2eff} = \frac{\varepsilon_{SiO2}}{\varepsilon_2} T_2 \qquad \text{(Expression 2)}$$

$$T_{eff} = T_{1eff} + T_{2eff} = \varepsilon_{SiO2}\left(\frac{T_1}{\varepsilon_1} + \frac{T_2}{\varepsilon_2}\right) \qquad \text{(Expression 3)}$$

For example, when relative dielectric constants of silicon oxide, titanium oxide, and titanium silicate are shown by $\varepsilon_{SiO2}=4$, $\varepsilon_1=60$, and $\varepsilon_2=15$, and when the film thicknesses are shown by $T_1=15$ nm, $T_2=3$ nm, and $T=18$ nm, the equivalent thicknesses become as shown by $T_{1eff}=1$ nm, $T_{2eff}=0.8$ nm, and $T_{eff}=1.8$ nm.

Figure 22:
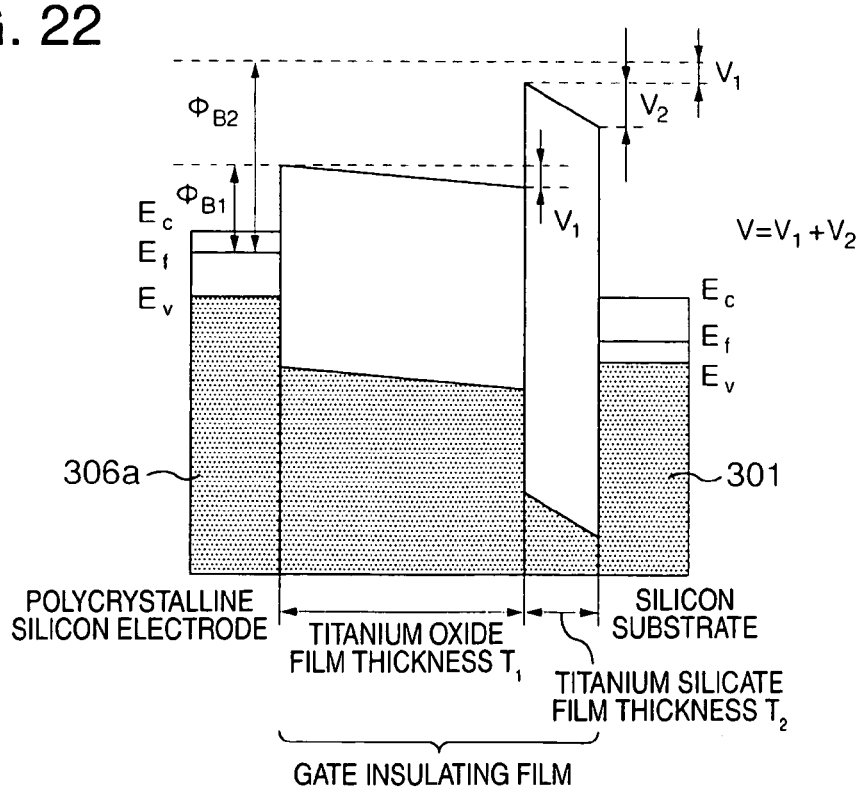
FIG. 22 is the conceptual diagram showing energy bands of the gate electrode, titanium oxide, titanium silicate and silicon substrate when the electric voltage, V, was applied to the gate electrode in the example shown in FIG. 19.

FIG. 22 shows energy bands when a positive electric voltage V is applied to the gate electrode. In this case, to the titanium oxide film and the titanium silicate film there are applied electric voltages $V_1$ and $V_2$ and electric fields $E_{ox1}$ and $E_{ox2}$ respectively represented by the following expressions:

$$V_1 = \frac{\varepsilon_2 T_1}{\varepsilon_2 T_1 + \varepsilon_1 T_2} V \qquad \text{(Expression 4)}$$

$$V_2 = \frac{\varepsilon_1 T_2}{\varepsilon_2 T_1 + \varepsilon_1 T_2} V \qquad \text{(Expression 5)}$$

$$E_{ox1} = \frac{V_1}{T_1} \qquad \text{(Expression 6)}$$

$$E_{ox2} = \frac{V_2}{T_2} \qquad \text{(Expression 7)}$$

Tunnel electric current J flowing through the gate insulating film consisting of titanium oxide film and titanium silicate film shown above can be obtained by the following Expression 8 from the probability of electron's tunneling through the insulating film by use of WKB (Wentzel-Kramers-Brillouin) approach.

$$J(\Phi_B, T_{ox}, E_{ox}) = \frac{n_v m_d k_B T}{2\pi^2 \hbar} \int T^* T_{WKB}(\Phi_{B1}, \Phi_{B2}, T_1, T_2, E_{ox1}, E_{ox2}, E) \ln\left(1 + \exp\left(\frac{E_F - E}{k_B T}\right)\right) dE \quad \text{(Expression 8)}$$

$$T * T_{WKB}(\Phi_{B1}, \Phi_{B2}, T_1, T_2, E_{ox1}, E_{ox2}, E) = \exp\{A_1(E_{n1} - E_{n2}) + A_2(E_{n3} - E_{n4})\}$$

$$A_1 = \frac{4\sqrt{2m_{ins}}}{3\hbar q E_{ox1}}$$

$$A_2 = \frac{4\sqrt{2m_{ins}}}{3\hbar q E_{ox2}}$$

$$E_{n1} = \begin{cases} \{\Phi_{B1} - (E - E_F)\}^{3/2} & E < \Phi_{B1} + E_F \\ 0 & E \geq \Phi_{B1} + E_F \end{cases}$$

$$E_{n2} = \begin{cases} \{\Phi_{B1} - (E - E_F) - V_1\}^{3/2} & E < \Phi_{B1} + E_F - V_1 \\ 0 & E \geq \Phi_{B1} + E_F - V_1 \end{cases}$$

$$E_{n3} = \begin{cases} \{\Phi_{B2} - (E - E_F) - V_1\}^{3/2} & E < \Phi_{B2} + E_F - V_1 \\ 0 & E \geq \Phi_{B2} + E_F - V_1 \end{cases}$$

$$E_{n4} = \begin{cases} \{\Phi_{B2} - (E - E_F) - (V_1 + V_2)\}^{3/2} & E < \Phi_{B2} + E_F - (V_1 + V_2) \\ 0 & E \geq \Phi_{B2} + E_F - (V_1 + V_2) \end{cases}$$

In the above expressions, $n_v$: gate electrode electronic state degeneracy degree,
$m_d$: gate electrode electron effective mass,
$k_B$: Boltzmann constant,
T: temperature,
π: circular constant,
h: Planck constant (in the expressions—is added to h),
$M_{ins}$: insulating film electron effective mass,
E: energy of electrons, and
$E_F$: Fermi energy of gate electrode.

Figure 23:
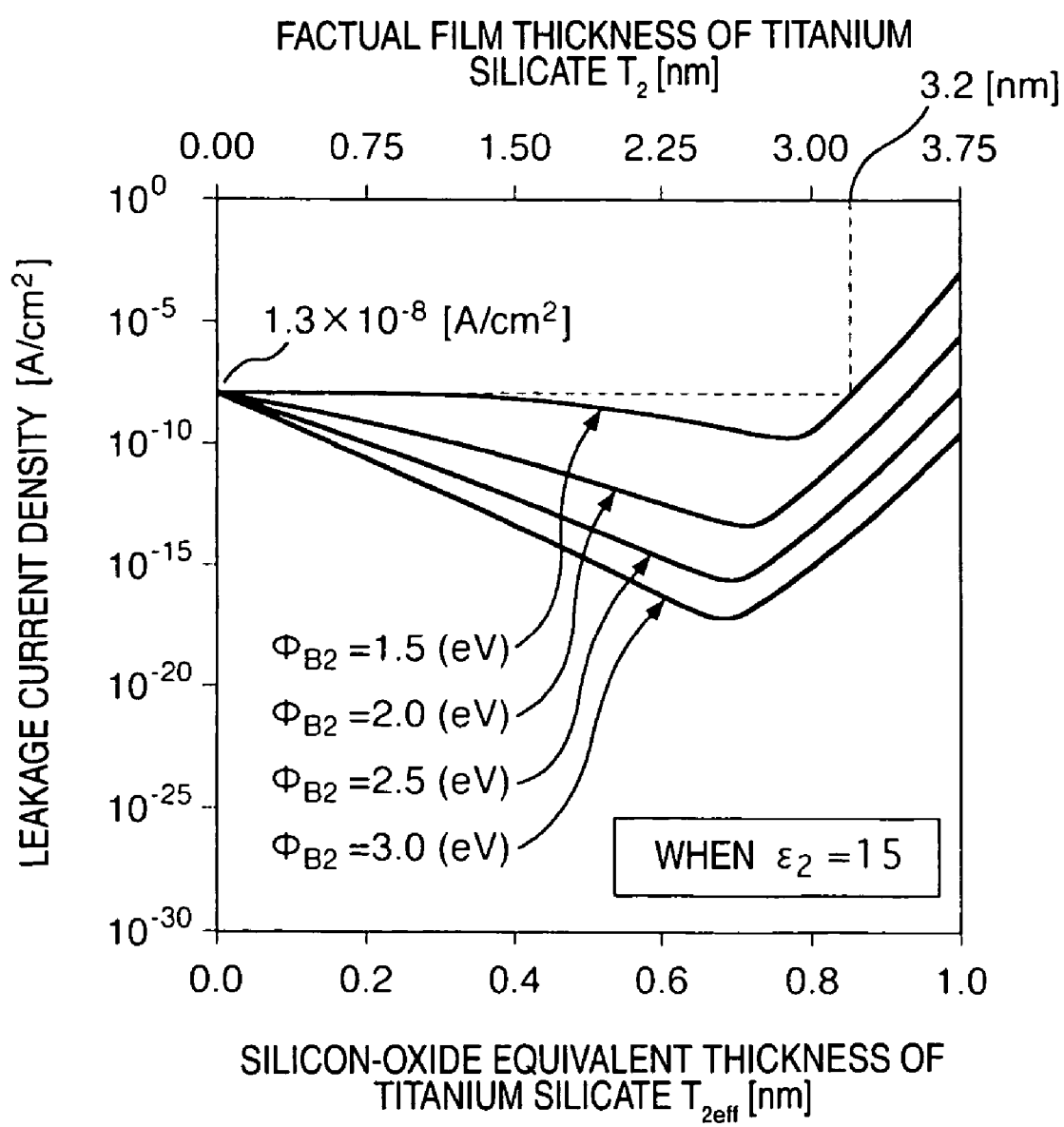
FIG. 23 is the graph showing dependency of leakage current density on the thickness and equivalent thickness of titanium silicate film when the relative dielectric constant of titanium silicate is 15, the silicon-oxide equivalent thickness of the gate insulating film is 1.0 nm, and the electric voltage applied to the gate insulating film is 1.0 V in the ninth example of the present invention.

FIG. 23 shows dependency of leakage current density on the film thickness $T_2$ and equivalent thickness $T_{2\mathit{eff}}$ of titanium silicate, when the relative dielectric constant $\in_2$ of titanium silicate is 15, applied electric voltage is 1 V, temperature is 300 K, and the equivalent thickness $T_{\mathit{eff}}$ of the gate insulating film is 1.0 nm. The figure shows results of calculation when the energy barrier $\Phi_{B2}$ of titanium silicate is 1.5, 2.0, 2.5, and 3.0 eV. The leakage current density is about $1.3 \times 10^{-8}$ A/cm² when the gate insulating film consists of only titanium oxide, that is, $T_2$=0 nm, and the leakage current density decreases as the film thickness of titanium silicate increases. This is because a part of the electrons which can surpass the low energy barrier of titanium oxide cannot surpass the energy barrier of the silicate.

The leakage current density shows the minimum value when the equivalent thickness of titanium silicate is about 0.7 nm and the factual film thickness is about 2.5 nm, and the leakage current increases in accordance with increase in the film thickness of titanium silicate. This is because electrons permeate the energy barrier made by titanium silicate through direct tunnels and tunnel current flows.

From FIG. 23, it is seen that the leakage current density changes depending on the value of energy barrier of titanium silicate. However, when the electric voltage applied to the gate insulating film is 1 V and $T_2$ is 3.2 nm or less, it is seen that the leakage current can be suppressed to a lower value than the leakage current density in the case where the gate insulating film consists of only titanium oxide even when the value of energy barrier of titanium silicate changes.

Figure 24:
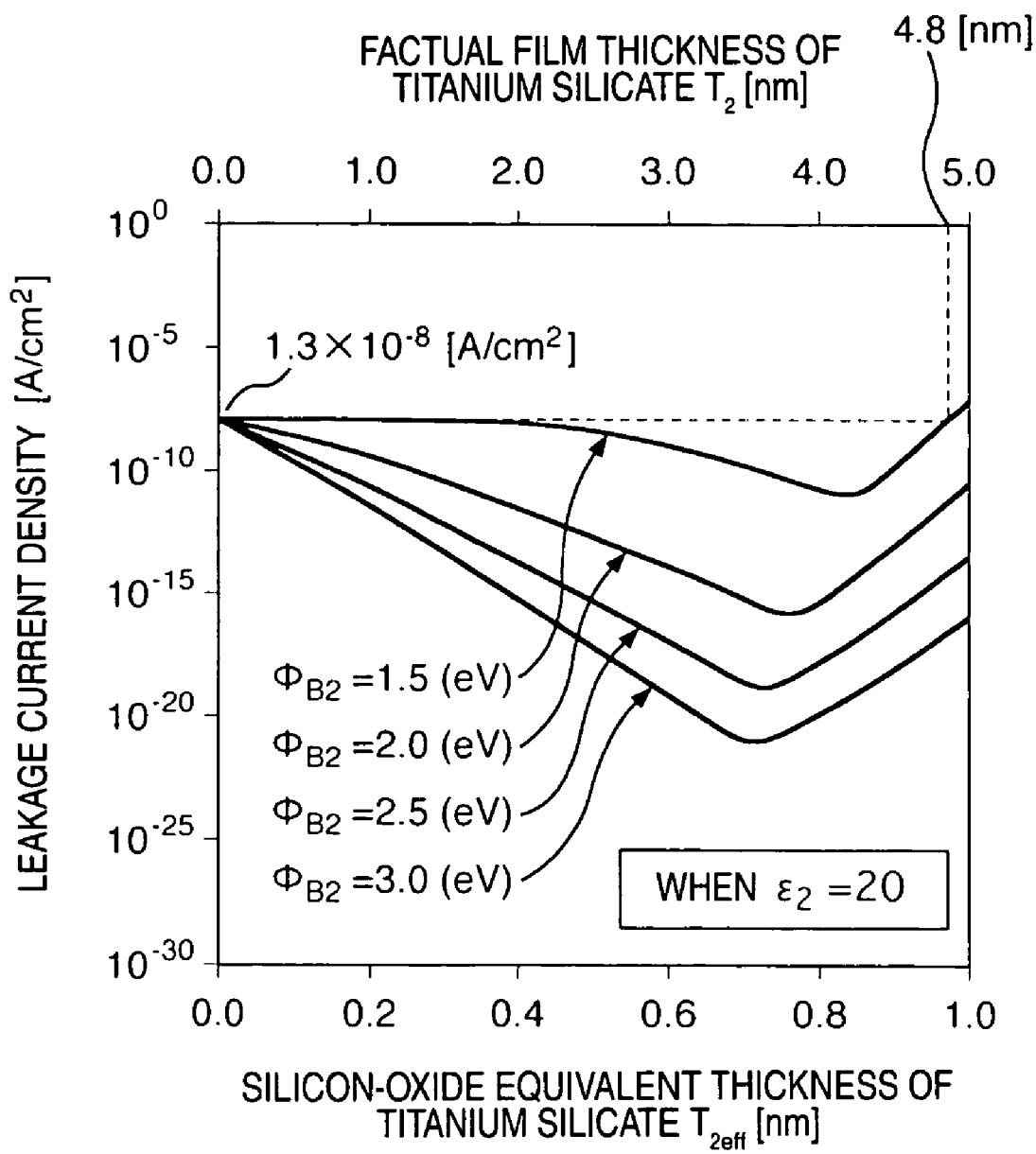
FIG. 24 is the graph showing dependency of leakage current density on the thickness and equivalent thickness of titanium silicate film when the relative dielectric constant of titanium silicate is 20, the silicon-oxide equivalent thickness of the gate insulating film is 1.0 nm, and the electric voltage applied to the gate insulating film is 1.0 V in the ninth example of the present invention.

Next, FIG. 24 shows dependency of leakage current density on the film thickness $T_2$ and equivalent thickness $T_{2\mathit{eff}}$ of titanium silicate, when the relative dielectric constant $\in_2$ of titanium silicate is 20, the electric voltage applied to the gate insulating film is 1 V, and the equivalent thickness $T_{\mathit{eff}}$ of the gate insulating film is 1.0 nm. Similarly to FIG. 23, the leakage current density decreases as the thickness of titanium silicate film increases from the point of $T_2$=0 nm, and the leakage current density shows the minimum value when the equivalent thickness of titanium silicate film is about 0.8 nm and the factual film thickness is about 4.0 nm. Furthermore, if $T_2$ is 4.8 nm or less, it is seen that the leakage current can be suppressed to a lower value than the leakage current density in the case where the gate insulating film consists of only titanium oxide even when the value of energy barrier of titanium silicate changes.

Figure 25:
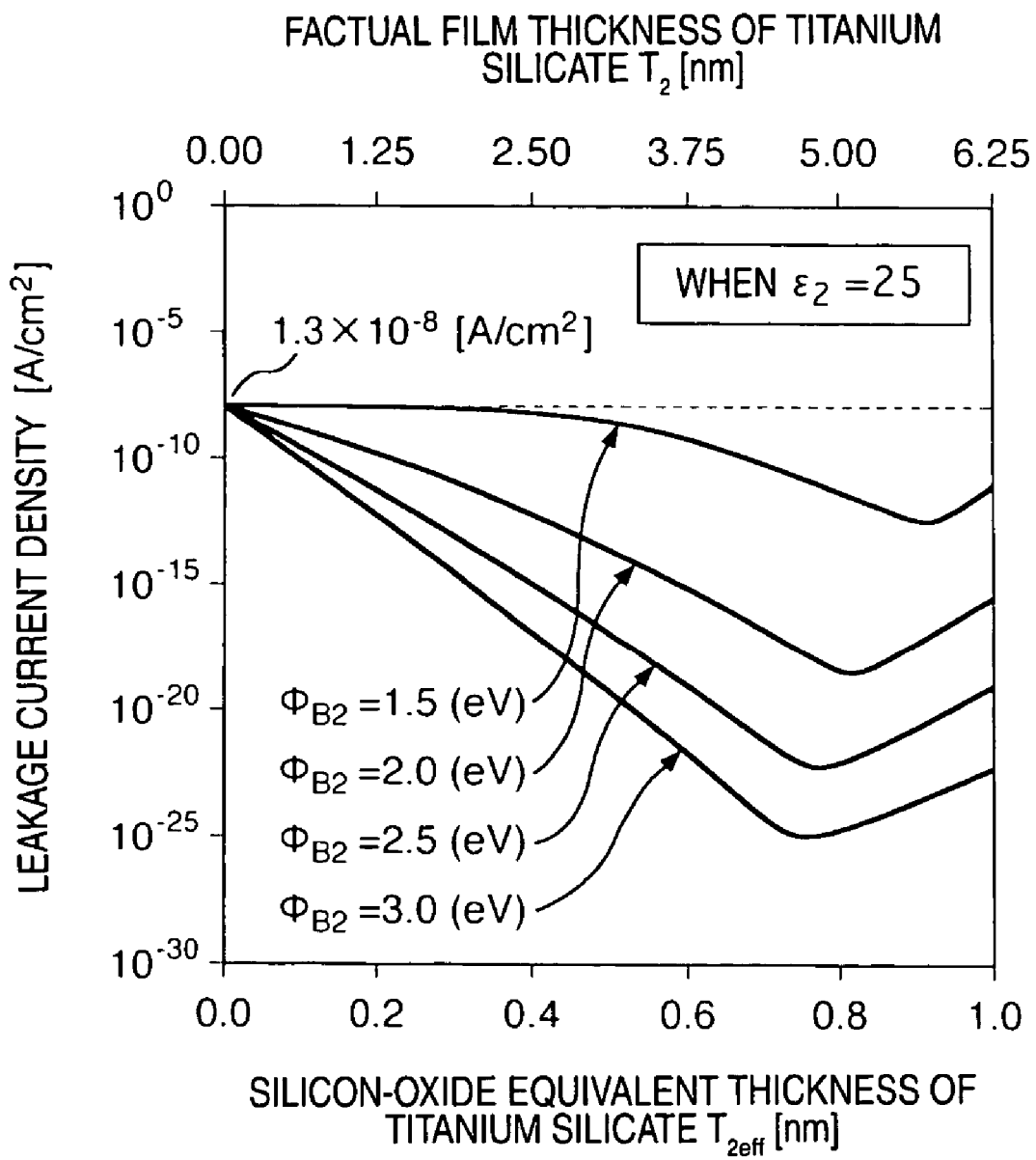
FIG. 25 is the graph showing dependency of leakage current density on the thickness and equivalent thickness of titanium silicate film when the relative dielectric constant of titanium silicate is 25, the silicon-oxide equivalent thickness of the gate insulating film is 1.0 nm, and the electric voltage applied to the gate insulating film is 1.0 V in the ninth example of the present invention.
Figure 26:
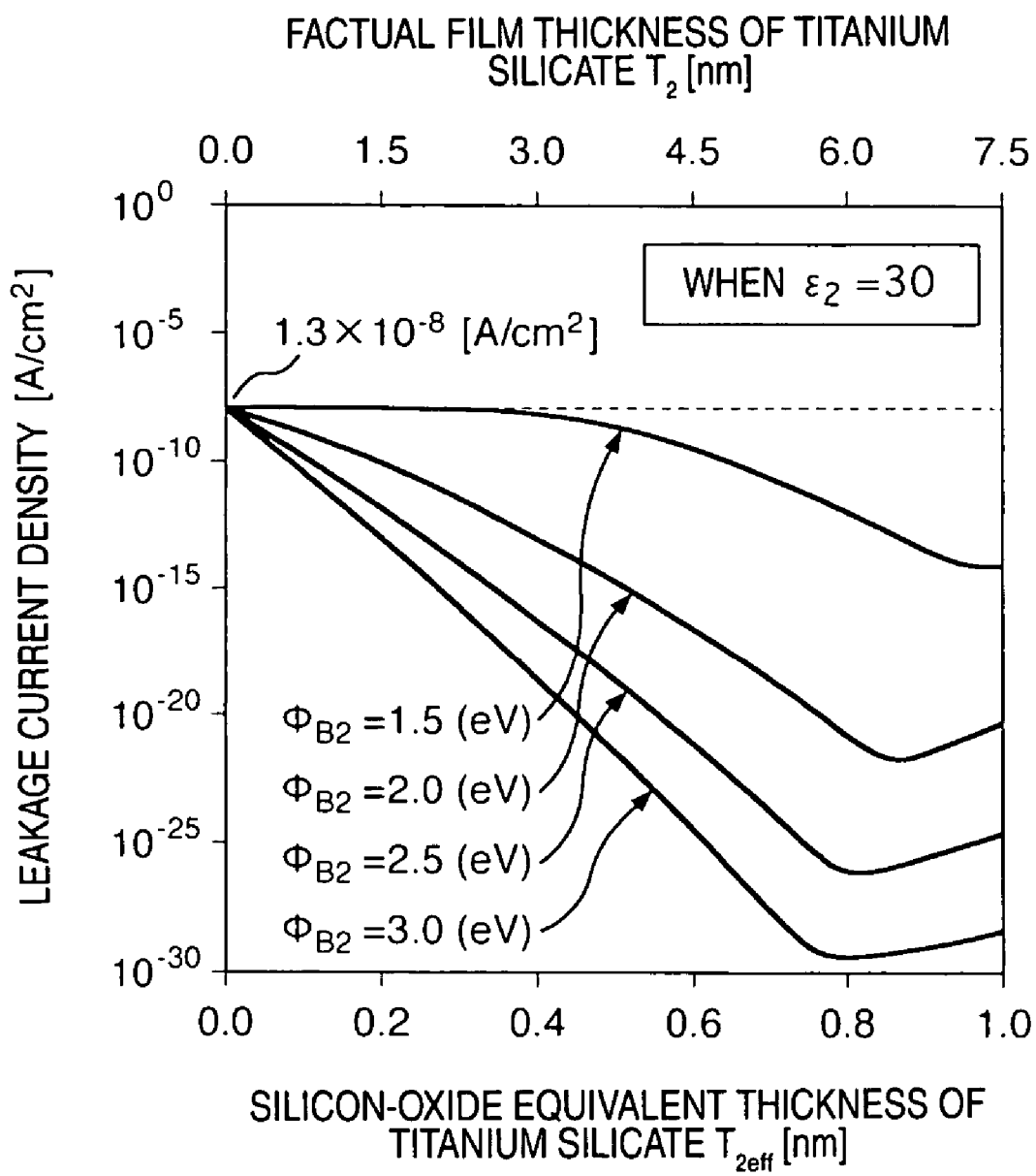
FIG. 26 is the graph showing dependency of leakage current density on the thickness and equivalent thickness of titanium silicate film when the relative dielectric constant of titanium silicate is 30, the silicon-oxide equivalent thickness of the gate insulating film is 1.0 nm, and the electric voltage applied to the gate insulating film is 1.0 V in the ninth example of the present invention.

On the basis of the similar calculations, FIG. 25 and FIG. 26 show dependency of leakage current density on the film thickness $T_2$ and equivalent thickness $T_{2\mathit{eff}}$ of titanium silicate, when the relative dielectric constant $\in_2$ of titanium silicate is 25 and 30. From the figures, if the condition of the equivalent thickness 1 nm of gate insulating film is satisfied by the film thickness of titanium silicate, it is seen that the leakage current can be suppressed to a lower value than the leakage current density in the case where the gate insulating film consists of only titanium oxide, even when the value of energy barrier of titanium silicate changes, by providing a titanium silicate film.

Furthermore, in order to give good dielectric characteristics to a titanium silicate film, at least one lattice of thickness is considered to be necessary, and hence factual thickness $T_2$ should be 1 nm or more.

From the above, even when the relative dielectric constant $\Phi_2$ of titanium silicate is changed in the range of 15 to 30 and the energy barrier $\Phi_{B2}$ thereof is changed in the range of 1.5 eV to 3.0 eV, the value of leakage current flowing through the gate insulating film can be suppressed to a low value, by forming a titanium silicate film in a factual thickness $T_2$ of 1.0 nm to 3.2 nm.

Hereinabove, there was described the case where the silicon-oxide equivalent thickness of gate insulating film was 1 nm, the electric voltage applied to gate insulating film was 1 V, and temperature was 300° K. Also in the case of the other silicon-oxide equivalent thickness, electric voltage and temperature, the film thickness of titanium silicate suitable for suppressing leakage current can be decided by the similar process.

Figure 27:
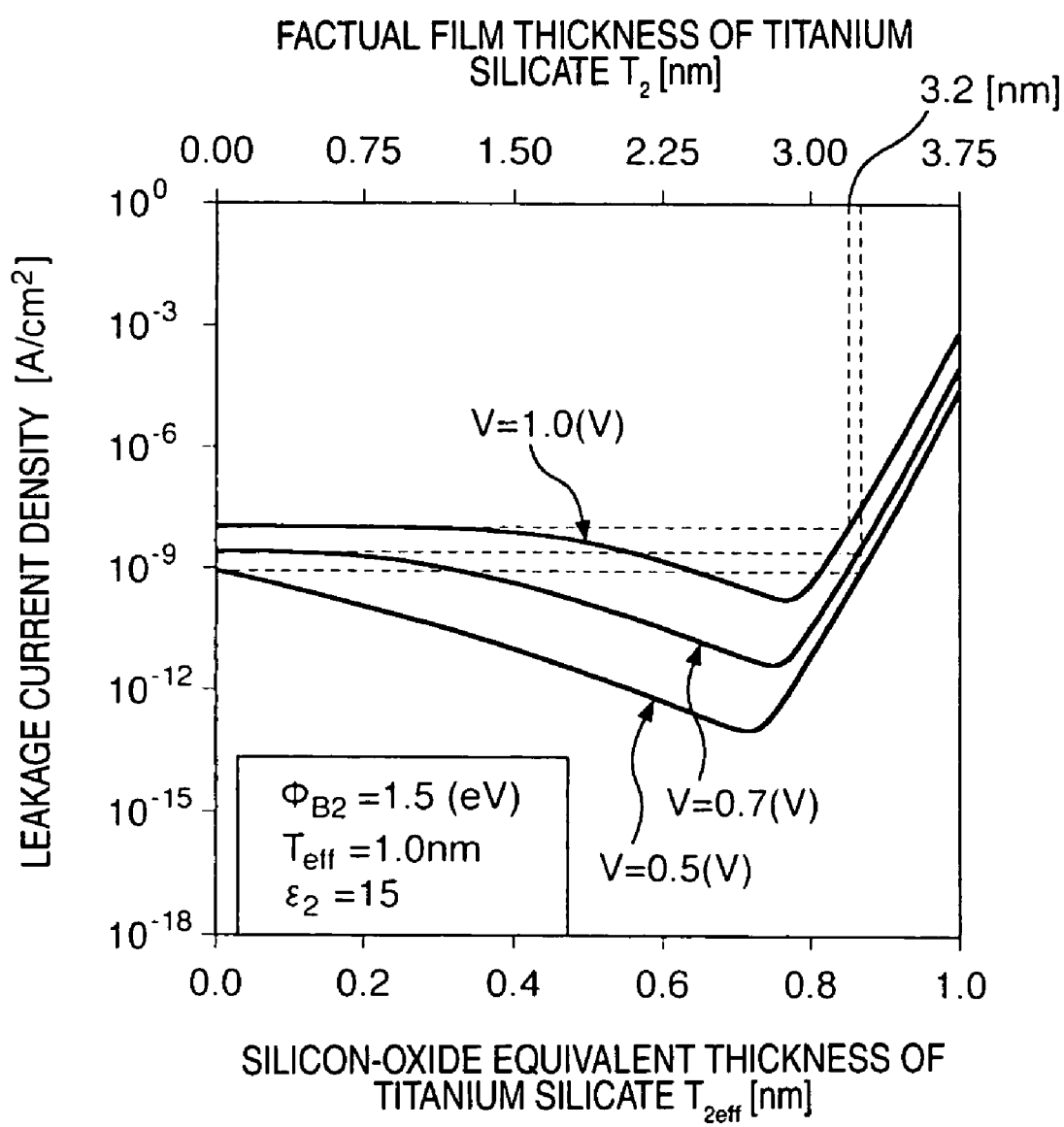
FIG. 27 is the graph showing dependency of leakage current density on the thickness and equivalent thickness of titanium silicate film when the relative dielectric constant of titanium silicate is 15, the silicon-oxide equivalent thickness of the gate insulating film is 1.0 nm, and the electric voltage applied to the gate insulating film is 0.5, 0.7, and 1.0 V in the ninth example of the present invention.
Figure 28:
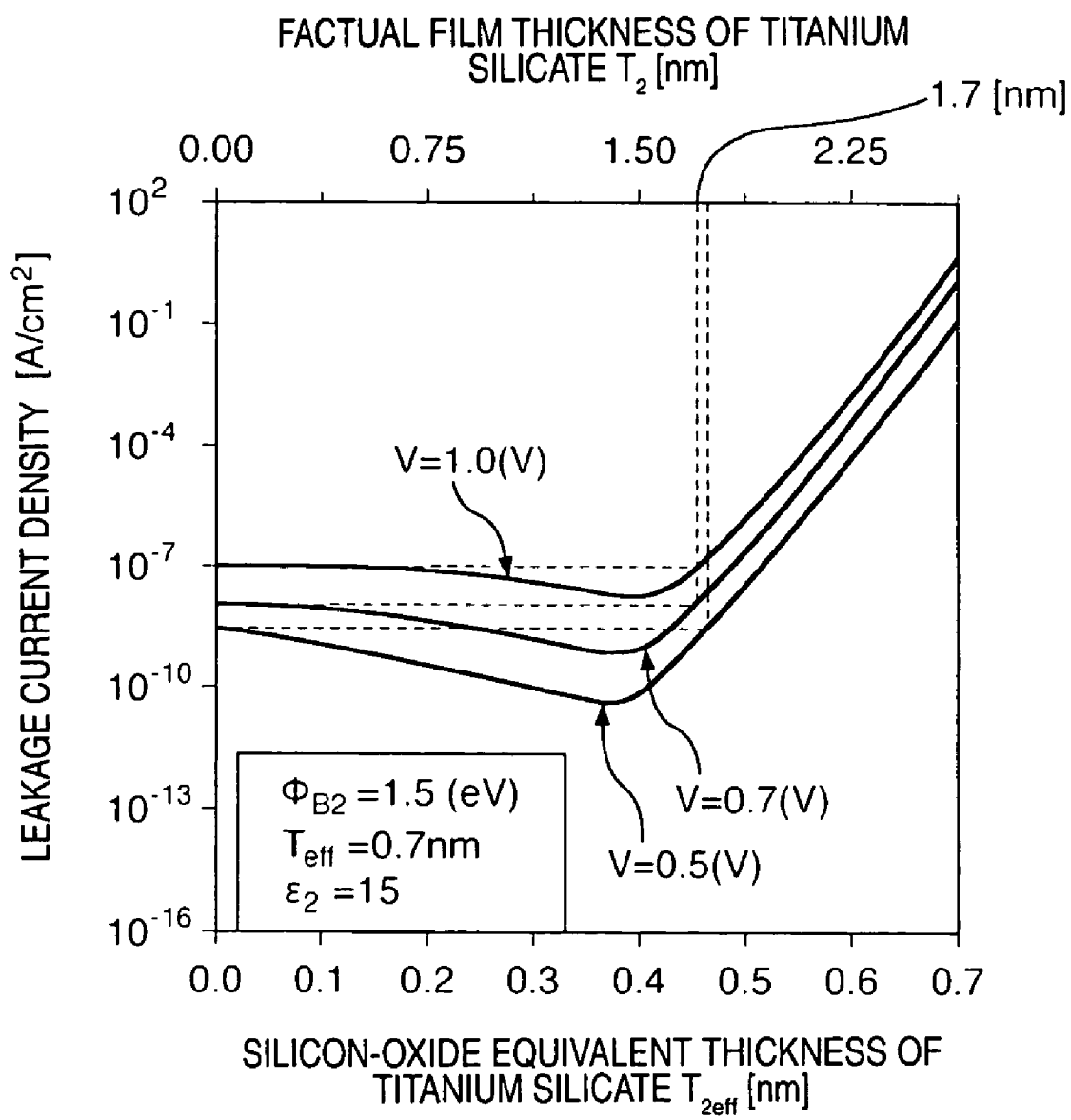
FIG. 28 is the graph showing dependency of leakage current density on the thickness and equivalent thickness of titanium silicate film when the relative dielectric constant of titanium silicate is 15, the silicon-oxide equivalent thickness of the gate insulating film is 0.7 nm, and the electric voltage applied to the gate insulating film is 0.5, 0.7, and 1.0 V in the ninth example of the present invention.
Figure 29:
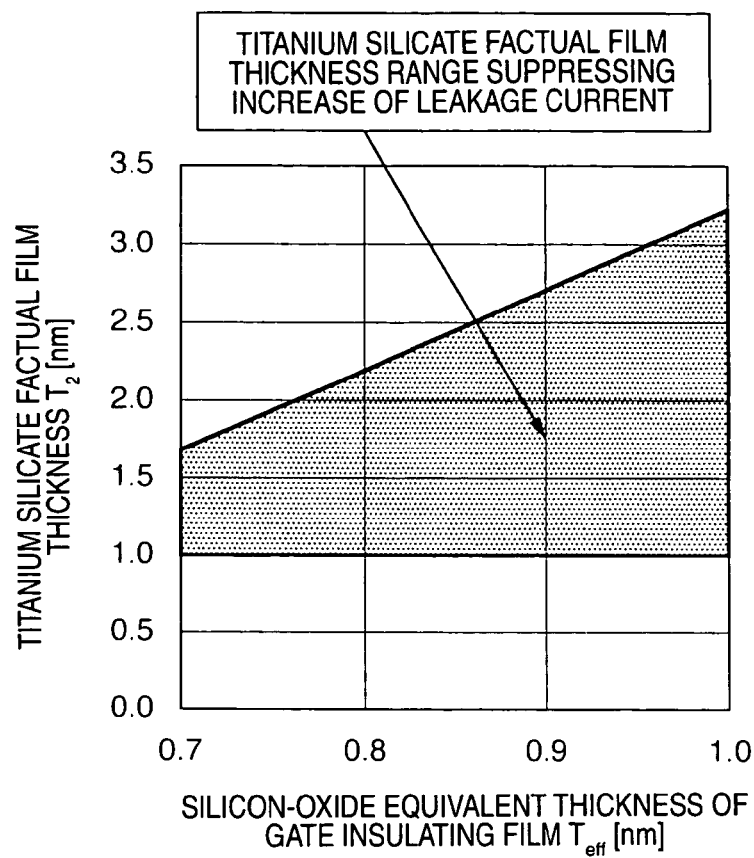
FIG. 29 is the graph showing the desirable range of factual film thickness of titanium silicate when the silicon-oxide equivalent thickness of the gate insulating film is 0.7 to 1.0 nm in the ninth example of the present invention.

Next, in the case where the electric voltage applied to gate is 0.5 to 1 V and the equivalent thickness is 0.7 to 1 nm, with regard to the film thickness of titanium silicate suitable for suppressing leakage current, descriptions are given by use of FIG. 27, FIG. 28 and FIG. 29.

FIG. 27 shows dependency of leakage current density on the film thickness $T_2$ and equivalent thickness $T_{2eff}$ of titanium silicate, when the relative dielectric constant $\Phi_2$ of titanium silicate is 15, temperature is 300° K, and the equivalent thickness $T_{eff}$ of the gate insulating film is 1.0 nm. The figure is based on calculations in the case where the applied electric voltage is 0.5 V, 0.7 V and 1 V and the energy barrier $\Phi_{D2}$ of titanium silicate is 1.5 eV.

As shown in FIG. 27, the leakage current density decreases as the thickness of titanium silicate film increases from the case where the gate insulating film consists of only titanium oxide, that is, $T_2=0$ nm. This is because a part of the electrons which can surpass the low energy barrier of titanium oxide cannot surpass the energy barrier made by titanium silicate.

Furthermore, it is seen that the leakage current density shows the minimum value when the equivalent thickness of titanium silicate is 0.7 nm and the factual film thickness is about 2.5 nm, and that the leakage current increases in accordance with increase in the film thickness of titanium silicate. This is because electrons permeate the energy barrier made by titanium silicate through direct tunnels and tunnel current flows.

From FIG. 27, it is seen that the leakage current density changes depending on the value of applied electric voltage. However, when the applied electric voltage is in the range of 0.5 to 1 V, if $T_2$ is 3.2 nm or less, it is seen that the leakage current can be suppressed to a lower value than the leakage current density in the case where the gate insulating film consists of only titanium oxide.

In FIG. 27, there is shown the case where the energy barrier $\Phi_{B2}$ of titanium silicate is 1.5 eV and the relative dielectric constant $\in_2$ is 15. As stated above with reference to FIG. 23–FIG. 26, also in the case where the energy barrier $\Phi_{B2}$ is 1.5 to 3.0 eV and the relative dielectric constant $\in_2$ is 15 to 30, if $T_2$ is 3.2 nm or less, it can be shown that the leakage current can be suppressed to a lower value than the leakage current density in the case where the gate insulating film consists of only titanium oxide.

FIG. 28 shows dependency of leakage current density on the film thickness $T_2$ and equivalent thickness $T_{2eff}$ of titanium silicate, when the relative dielectric constant $\in_2$ of titanium silicate is 15, temperature is 300° K, and the equivalent thickness $T_{eff}$ of the gate insulating film is 0.7 nm. The figure is based on calculations in the case where the applied electric voltage is 0.5 V, 0.7 V and 1 V and the energy barrier $\Phi_{B2}$ of titanium silicate is 1.5 eV.

From FIG. 28, it is seen that the leakage current density changes depending on the value of applied electric voltage. However, when the applied electric voltage is in the range of 0.5 to 1 V and the equivalent thickness $T_{eff}$ of the gate insulating film is 0.7 nm, if the film thickness $T_2$ of titanium silicate is 1.7 nm or less, it is seen that the leakage current can be suppressed to a lower value than the leakage current density in the case where the gate insulating film consists of only titanium oxide.

In FIG. 28, there is shown the case where the energy barrier $\Phi_{B2}$ of titanium silicate is 1.5 eV, the silicon-oxide equivalent thickness $T_{eff}$ of the gate insulating film is 0.7 nm and the relative dielectric constant $\in_2$ is 15. As stated above with reference to FIG. 23–FIG. 26, also in the case where the energy barrier $\Phi_{B2}$ is 1.5 to 3.0 eV and the relative dielectric constant $\in_2$ is 15 to 30, if $T_2$ is 1.7 nm or less, it can be seen that the leakage current can be suppressed to a lower value than the leakage current density in the case where the gate insulating film consists of only titanium oxide.

For each thickness in the case where the silicon-oxide equivalent thickness of the gate insulating film is 0.7 to 1.0 nm, the range of factual film thickness of titanium silicate for suppressing increase of leakage current can be obtained by the similar process. FIG. 29 summarizes said desirable range of factual film thickness of titanium silicate corresponding to the silicon-oxide equivalent thickness 0.7–1.0 nm of the gate insulating film in the case where electric voltage applied to the gate is 0.5–1.0 V. The desirable range of factual film thickness of titanium silicate shown in the figure corresponds to the case where the relative dielectric constant of titanium silicate is 15, and in the case where the relative dielectric constant of titanium silicate is higher, a broader range can be obtained.

In addition, in the figure the factual film thickness $T_2$ of titanium silicate is indicated as 1.0 nm or more, and this is because at least one lattice of thickness is necessary for giving titanium silicate good dielectric characteristics.

The range of the factual film thickness $T_2$ of titanium silicate shown in FIG. 29 is represented by the following expression as a function of the silicon-oxide equivalent thickness $T_{eff}$ of the gate insulating film:

1.0 (nm)$\leq T_2 \leq 5T_{eff}-1.8$ (nm), wherein 0.7 (nm) $\leq T_{eff} \leq 1.0$ (nm).

That is, a semiconductor device having a gate insulating film wherein increase of leakage current is suppressed can be obtained by forming, between titanium oxide and a silicon substrate, a titanium silicate film having a thickness in the range of factual film thickness shown in FIG. 29 in response to the silicon-oxide equivalent thickness $T_{eff}$ of the gate insulating film required by the specification of the semiconductor device.

In the above working embodiment, there was described the case of a polycrystalline silicon film doped with phosphorus as a gate electrode. In addition to the polycrystalline silicon film, also in the case of a gate electrode consisting of a metal thin film such as tungsten, molybdenum or the like, a metal compound such as tungsten nitride or the like, or a metal silicide film such as tungsten silicide or the like, or the laminated structure thereof, the film thickness of titanium silicate adequate for suppressing leakage current can be similarly decided by such process.

Figure 30:
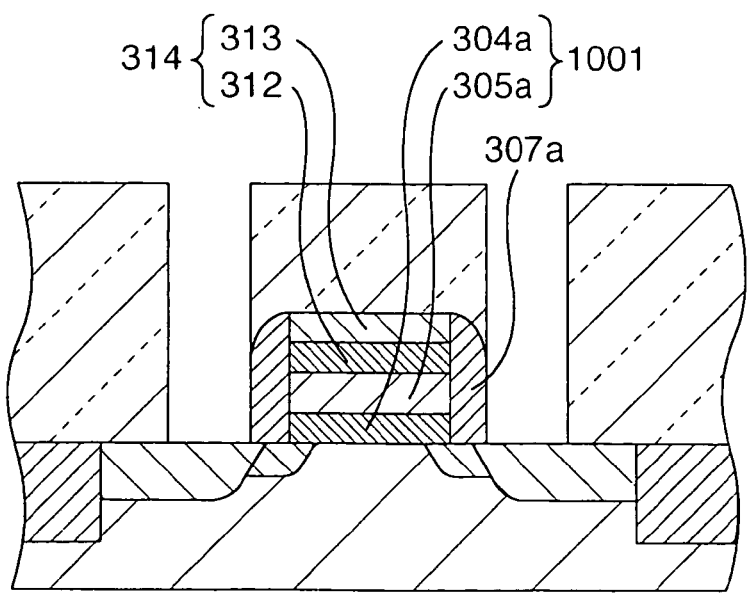
FIG. 30 is the sectional view showing an example wherein the gate electrode has a two layer structure of tungsten nitride film and tungsten film in the example shown in FIG. 19.

Because depletion does not occur in a gate electrode film formed of a metal film such as tungsten, molybdenum or the like, the equivalent thickness of a gate insulating film can be decreased. Furthermore, tungsten is thermally stable, and the film quality thereof is scarcely changed in a high temperature process after formation of the gate electrode film. In addition, when tungsten is laminated in contact with titanium oxide, tungsten oxide is formed in some cases. Tungsten oxide has a smaller dielectric constant than titanium oxide, and formation of tungsten oxide leads to the increase in the equivalent thickness of a gate insulating film. Therefore, it is effective to use a tungsten nitride or tungsten silicide film having excellent oxidation resistance as compared with a tungsten film. Particularly in oxidation resistance, a tungsten nitride film is especially excellent. Moreover, when the tungsten nitride film is used for a gate electrode, by forming a gate electrode 314 of a two-layer structure, wherein tungsten nitride 312 is used as a layer in contact with titanium oxide and tungsten 313 having a lower resistance than tungsten nitride is used as the upper layer as shown in FIG. 30, a gate electrode having a low resistance can be obtained.

As stated above, according to the present working embodiment, titanium silicate film is present at the interface between titanium oxide film and silicon substrate. Hence, a silicon oxide film having a low relative dielectric constant can be prevented from being formed at said interface and, at the same time, the silicon-oxide equivalent thickness can be decreased as compared with the case of providing silicon nitride at said interface. Thus there can be provided a semiconductor device having a gate insulating film which can satisfy miniaturization.

Furthermore, according to the present working embodiment, a gate insulating film is constituted by a laminated structure of titanium oxide film as a high dielectric constant material and titanium silicate film having a relatively large dielectric constant. Hence, while the factual thickness of the gate insulating film can be made thick, the silicon-oxide equivalent thickness can be made thin, and leakage current can be reduced.

Moreover, according to the present working embodiment, because there can be obtained a semiconductor device wherein leakage current hardly flows, there can be obtained a semiconductor device having high reliability, and also there can be obtained a semiconductor device having a high yield.

Figure 31A:
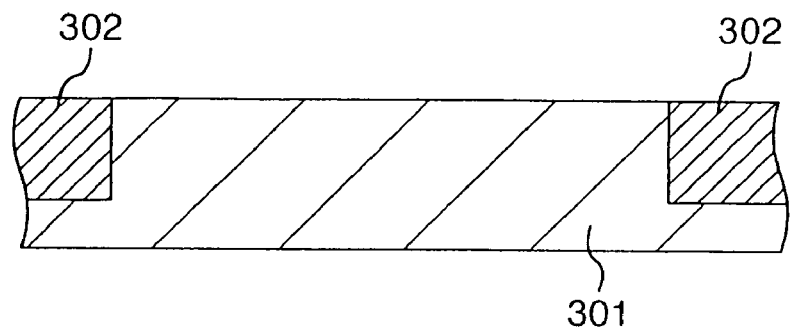
FIGS. 31(A)–31(C) show sectional views for illustrating a phase in the process of producing the main portion of the semiconductor device shown in FIG. 19.
Figure 31B:
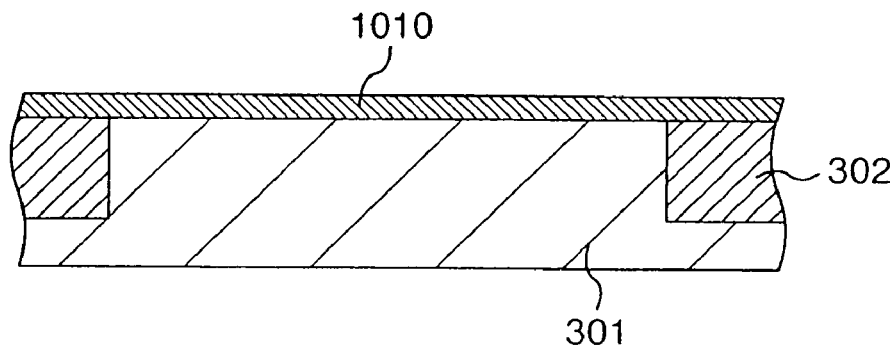
Figure 31C:
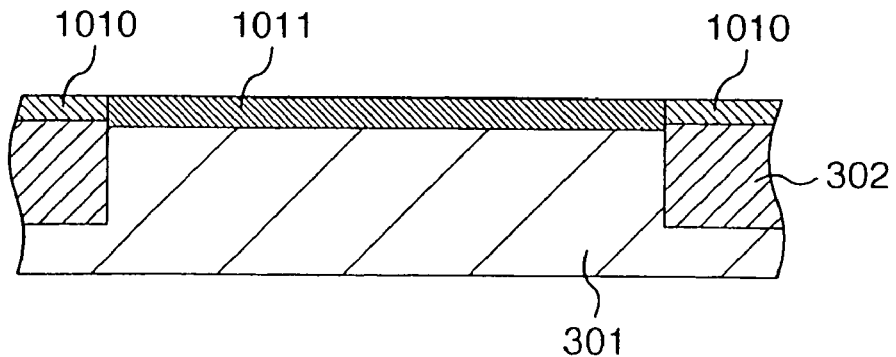
Figure 32A:
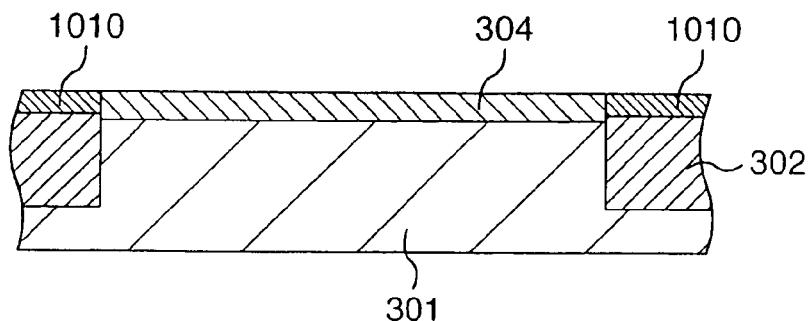
FIGS. 32(A)–32(C) show sectional views for illustrating a phase in the process of producing the main portion of the semiconductor device shown in FIG. 19, which follow FIGS. 31(A)–31(C).
Figure 32B:
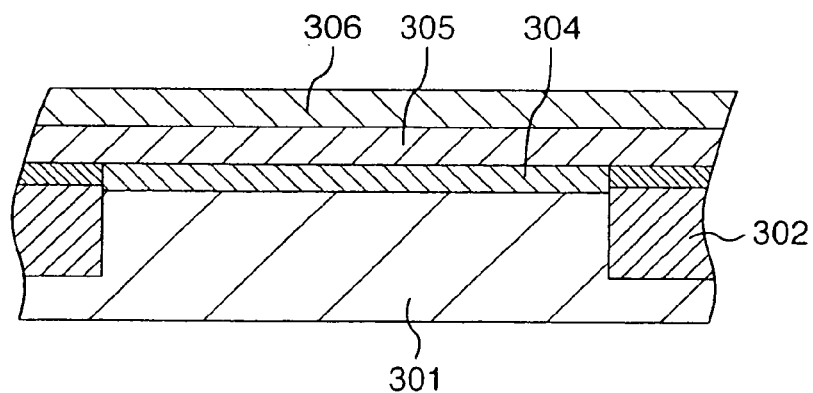
Figure 32C:
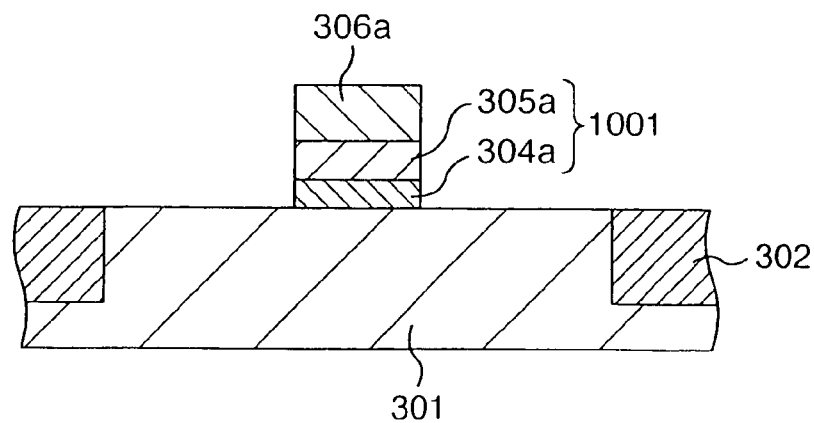
Figure 33A:
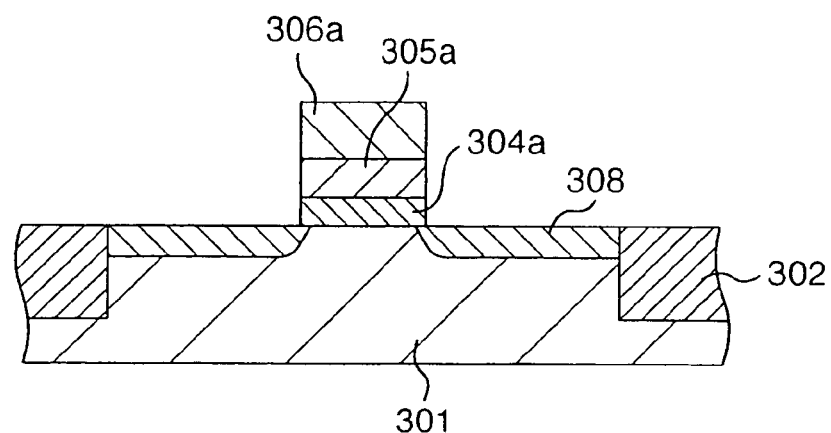
FIGS. 33(A)–33(C) show sectional views for illustrating a phase in the process of producing the main portion of the semiconductor device shown in FIG. 19, which follow that of FIGS. 32(A)–32(C).
Figure 33B:
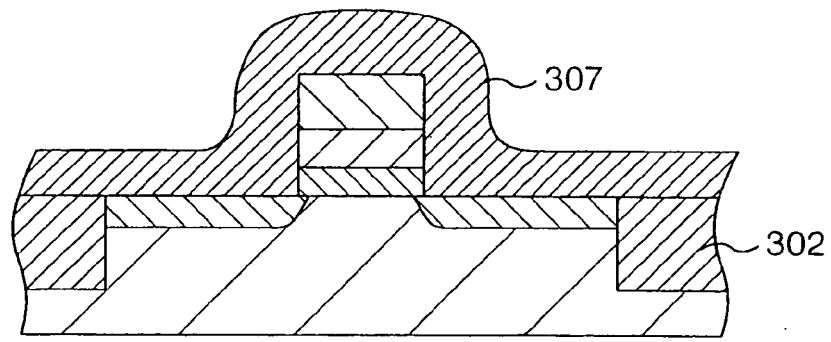
Figure 33C:
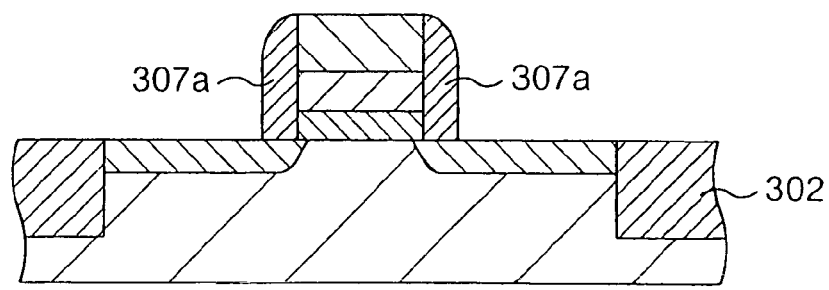
Figure 34A:
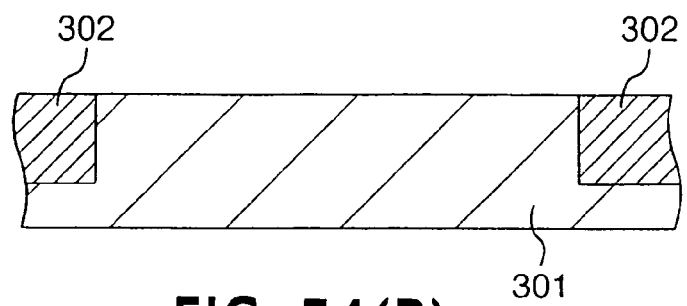
FIGS. 34(A)–34(D) show sectional views for illustrating an alternative early phase in the process of producing the main portion of the semiconductor device shown in FIG. 19.
Figure 34B:
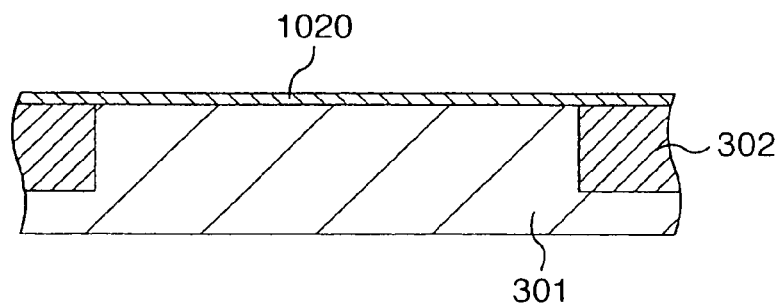
Figure 34C:
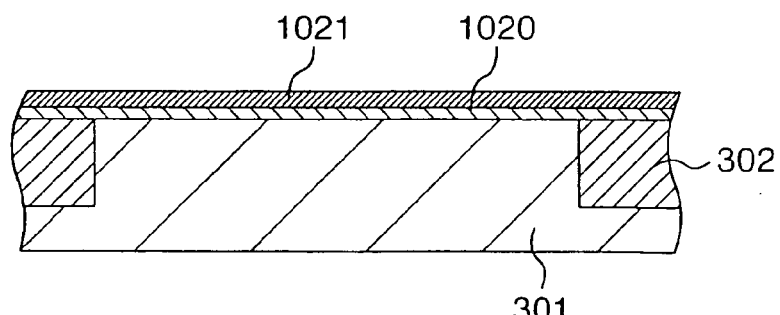
Figure 34D:
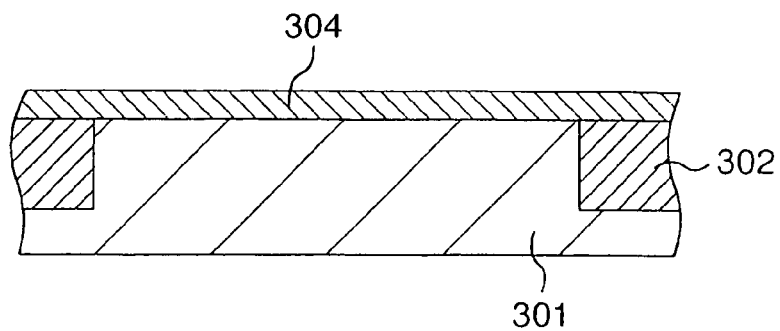

The tenth example of the present invention is described by use of FIG. 31 (including FIGS. 31(A)–31(C)), FIG. 32 (including FIGS. 32(A)–32(C)) and FIG. 33 (including FIGS. 33(A)–33(C)). FIG. 31, FIG. 32 and FIG. 33 show a process for preparing the semiconductor device having a gate insulating film consisting of titanium oxide film and titanium silicate film shown in FIG. 19. Herein, there is described the case wherein the factual thickness of titanium silicate film is 3 nm and the factual film thickness of titanium oxide is 3 nm.

First, plural grooves of 200–300 nm in depth are formed at a predetermined interval on the surface of a P type silicon substrate 301, and silicon oxide films are embedded therein to form element-separating films 302 of shallow groove type (FIG. 31 (A)).

Next, a titanium film 1010 of about 1 nm in thickness is formed on the surface of the silicon substrate 301 by, for example, sputtering method (FIG. 31 (B)). Next, the titanium film 1010 is subjected to heat treatment of 600° C. to form titanium silicide film 1011. By this silicide reaction, the thickness of titanium silicide film 1011 becomes about 2 nm (FIG. 31 (C)). In addition, at this time, the portions in contact with element-separating films 302 are left as such without being changed into the silicide.

Next, the titanium silicide film 1011 is oxidized to form titanium silicate film 304 (FIG. 32 (A)). This oxidization reaction causes volume expansion, and the thickness of titanium silicate film 304 becomes about 3 nm. When the thickness of titanium silicate film 304 is larger than 3 nm, the titanium silicate film 304 is subjected to etching by sputtering method or the like to reduce the film thickness into a predetermined thickness.

Next, a titanium oxide film 305 of about 3 nm in thickness is formed on the surface of titanium silicate film 304 by, for example, CVD (Chemical Vapor Deposition) method.

Herein, when the equivalent thickness of a gate insulating film having titanium silicate film 304 and titanium oxide film 305 is larger than 1 nm, the titanium oxide film 305 is subjected to etching by sputtering method or the like to reduce the film thickness into a predetermined equivalent thickness.

Furthermore, a polycrystalline silicon film 306 containing impure phosphorus is formed on the surface of titanium oxide film 305 by CVD method or the like. The thickness of the polycrystalline silicon film 306 is, for example, about 200 nm (FIG. 32 (B)).

Next, polycrystalline silicon film 306, titanium oxide film 305 and titanium silicate film 304 are subjected to etching by use of a photoresist film as a mask. Thereby, gate insulating film 1001 and gate electrode 306a of a MOS transistor are formed. Herein, the gate insulating film 1001 has titanium silicate film 304a and titanium oxide film 305a (FIG. 32 (C)).

Next, there are formed P-type source-drain regions 308 of the MOS transistor by ion implantation of boron. The P-type source-drain regions 308 are in the state of self-aligning to the gate electrode and gate insulating film (FIG. 33 (A)).

Subsequently, a silicon nitride film 307 of 200 nm in thickness is deposited on the surface of the semiconductor substrate by sputtering method or CVD method (FIG. 33 (B)), and the silicon nitride film 307 is subjected to etching to form side walls 307a covering the side walls of the gate electrode and gate insulating film on element-separating film 302 sides (FIG. 33 (C)).

Next, P+ type source-drain diffusion layers 309 are formed on the silicon substrate 301 by ion implantation of boron with a mask of element-separating films 302, gate electrode 306a and side walls 307a. Subsequently, by CVD method there is formed an interlaminar insulating film 310 covering element-separating films 302, gate electrode 306a, side walls 307a and P+ type source-drain diffusion layers 309, and in the resultant interlaminar insulating film 310 there are formed contact holes 311 leading to the surfaces of P+ type source-drain diffusion layers 309 from the surface thereof (see FIG. 19).

As stated above, first a titanium silicide film is formed on the surface of a silicon substrate, and then the titanium silicide film is oxidized into a titanium silicate film, on which a titanium oxide film is formed. This is because if the titanium oxide film is formed directly on the surface of the silicon substrate, oxygen atoms in the titanium oxide film diffuse to the silicon substrate side, as stated previously, and silicon oxide having a low dielectric constant is sometimes formed at the interface between the titanium oxide film and the silicon substrate, which leads to a defective MOS transistor.

In the present working embodiment, a titanium silicide film is formed on the surface of a silicon substrate, and then the titanium silicide film is oxidized into a titanium silicate film, and hence the surface of the silicon substrate is not contacted with oxygen atmosphere and there is no fear of formation of silicon oxide at the interface of the substrate. Furthermore, the titanium silicate film is formed on the surface of the silicon substrate and a titanium oxide film is laminated on the silicate film, and hence oxygen atoms in the titanium oxide film are prevented from diffusing to the silicon substrate side. Moreover, the relative dielectric constant of titanium silicate is 15–40 whereas that of silicon nitride is about 7.8. Therefore, as compared with the case where a silicon nitride film is formed at the interface between the titanium oxide film and the silicon substrate, the factual thickness of titanium silicate film can be made larger than that of silicon nitride film, when the silicon-oxide equivalent thickness is the same. Therefore, the effect of suppressing leakage current is large.

The above-mentioned preparation process relates to the case of a P channel MOS transistor. This preparation process is also applicable to a N channel MOS transistor, and, furthermore, is applicable, also, to a CMOS transistor and a BiCMOS transistor.

The eleventh example of the present invention is described by use of FIG. 34 (including FIGS. 34(A)–34(D)). FIG. 34 shows some steps of a process for preparing the semiconductor device having a gate insulating film consisting of titanium oxide film and titanium silicate film shown in FIG. 19. That is, FIGS. 34(A)–34(D) show the main process steps leading to the formation of a titanium silicate film on a silicon substrate. Herein, there is described, for example, the case where the factual thickness of titanium silicate is 3 nm and that of titanium oxide is 3 nm.

First, plural grooves of 200–300 nm in depth are formed at a predetermined interval on the surface of a P type silicon substrate 301, and silicon oxide films are embedded therein to form element-separating layers 302 of shallow groove type (FIG. 34 (A)).

Next, a silicon oxide film 1020 of about 1.5 nm in thickness is formed on the surface of the silicon substrate 301 by, for example, thermal oxidation method (FIG. 34 (B)).

Furthermore, on the above silicon oxide film, there is formed a titanium film 1021 of about 1.5 nm in thickness (FIG. 34 (C)).

Next, the above silicon oxide film 1020 and titanium film 1021 are reacted by heat treatment of 400° C. to 500° C. In this heat treatment, the silicon oxide film 1020 disappears and a titanium silicate film 304 is formed by reduction reaction of titanium (FIG. 34 (D)). The thickness of the above titanium silicate film 304 becomes about 3 nm, but when the thickness of titanium silicate film 304 is larger than 3 nm, the titanium silicate film 304 is subjected to etching by sputtering method or the like to reduce the film thickness and give a predetermined thickness. When the thickness is smaller, it is possible to give a predetermined film thickness by adjusting the thicknesses of the above silicon oxide film and titanium film.

In the subsequent steps, a gate insulating film, a gate electrode film and the like are formed to produce a MOS transistor similarly to FIG. 32 (B) step and the subsequent steps of the above tenth example.

In the present working embodiment, a silicon oxide film 1020 is once formed on a silicon substrate 301, but a titanium film 1021 is formed on the silicon oxide film 1020 and the two films are reacted by heat treatment into a titanium silicate film 304. Hence, the silicon oxide film 1020 having a low dielectric constant disappears. Next, a titanium oxide film is formed thereon and, therefore, at the time of forming the titanium oxide film oxygen atoms in the titanium oxide film are prevented from diffusing to the silicon substrate side at the interface with the silicon substrate.

That is, also in the present working embodiment, there can be obtained effects similar to those of the above tenth example. In addition, as examples of further preferred embodiments, the constitution concerning the gate electrode structure containing the gate insulating film shown in the above ninth to eleventh example can be applied to the corresponding portions in the first to eighth example.

According to the above ninth to eleventh examples, a titanium silicate film is present at the interface between titanium oxide film and silicon substrate. Hence, silicon oxide film having a low relative dielectric constant can be prevented from being formed at said interface, and at the same time the silicon-oxide equivalent thickness can be decreased as compared with the case of providing silicon nitride at said interface, and thus there can be provided a semiconductor device having a gate insulating film which can satisfy the desire for miniaturization.

Furthermore, a gate insulating film is constituted by a laminated structure of titanium oxide film as a high dielectric constant material and titanium silicate film having a relatively large dielectric constant. Hence, the factual thickness of the gate insulating film can be made thick, the silicon-oxide equivalent thickness can be made thin, and leakage current can thereby be reduced.

Moreover, because there can be obtained a semiconductor device wherein leakage current hardly flows, there can be provided a semiconductor device having high reliability, and also there can be provided a semiconductor device having a high yield.

The above descriptions were disclosed with reference to the various examples given. The present invention, however, should not be construed as being limited thereto. It should also be obvious to those skilled in the art that various changes and modifications can be performed to the various disclosed and/or other alternative examples that are within the spirit and scope of the present invention and the attached claims.

INDUSTRIAL APPLICABILITY

The present invention relates to a semiconductor device and can be adapted to a semiconductor device having high reliability. Preferably, the present invention can be adapted to a semiconductor device provided with a thin film capacitor having high reliability or a semiconductor device having a gate structure wherein leakage current is suppressed.

The invention claimed is:

1. A process for producing a thin film capacitor comprising a first capacitor electrode, a capacitor insulating film formed in contact with the first capacitor electrode, and a second capacitor electrode formed in contact with the capacitor insulating film; wherein said capacitor insulating film comprises mainly titanium oxide, and said first capacitor electrode and said second capacitor electrode are conductive oxide films comprising mainly ruthenium oxide or iridium oxide comprising the steps of:

forming said capacitor insulating film, said first capacitor electrode and said second capacitor electrode; and then carrying out a heat treatment at a temperature of 600° C.;

wherein, during said heat treatment, diffusion of oxygen to the first and second capacitor electrodes from the capacitor insulation film is suppressed and crystallinity of the titanium oxide is enhanced to provide an improved dielectric constant.

2. The process for producing a thin film capacitor of claim 1, wherein said capacitor insulating film and said conductive oxide film have a film thickness of not less than 0.9 nm.

3. The process for producing a thin film capacitor of claim 1, wherein said titanium oxide has rutile structure.

4. A process for producing a semiconductor device comprising a semiconductor substrate, a first capacitor electrode formed on one main surface side of said semiconductor substrate, a capacitor insulating film formed in contact with the first capacitor electrode, and a second capacitor electrode formed in contact with the capacitor insulating film, wherein said capacitor insulating film comprises mainly titanium oxide, and said first capacitor electrode and said second capacitor electrode are conductive oxide films comprising mainly ruthenium oxide or iridium oxide, comprising the steps of:

forming said capacitor insulating film, said first capacitor electrode and said second capacitor electrode; and then carrying out a heat treatment at a temperature of 600° C. wherein, during said heat treatment, diffusion of oxygen to the first and second capacitor electrodes from the capacitor insulation film is suppressed and crystallinity of the titanium oxide is enhanced to provide an improved dielectric constant.

5. The process for producing a semiconductor device of claim 4, wherein said capacitor insulating film and said conductive oxide film have a film thickness of not less than 0.9 nm.

6. The process for producing a semiconductor device of claim 4, wherein said capacitor insulating film and said conductive oxide film have a film thickness of not less than 0.9 nm.

* * * * *